(12) United States Patent
Galloway et al.

(10) Patent No.: US 9,913,497 B2
(45) Date of Patent: Mar. 13, 2018

(54) APPARATUSES AND METHODS FOR TESTING COMPONENTS OF AN AEROSOL DELIVERY DEVICE

(71) Applicant: RAI STRATEGIC HOLDINGS, INC., Winston-Salem, NC (US)

(72) Inventors: Michael Ryan Galloway, Winston-Salem, NC (US); Raymond Charles Henry, Jr., Cary, NC (US); Glen Kimsey, Cary, NC (US); Frederic Philippe Ampolini, Winston-Salem, NC (US)

(73) Assignee: RAI STRATEGIC HOLDINGS, INC., Winston-Salem, NC (US)

( * ) Notice: Subject to any disclaimer, the term of this patent is extended or adjusted under 35 U.S.C. 154(b) by 0 days.

(21) Appl. No.: 15/437,115

(22) Filed: Feb. 20, 2017

(65) Prior Publication Data
US 2017/0156405 A1 Jun. 8, 2017

Related U.S. Application Data

(62) Division of application No. 14/464,798, filed on Aug. 21, 2014, now Pat. No. 9,609,895.

(51) Int. Cl.
*A24F 47/00* (2006.01)
*G06F 11/27* (2006.01)
*G01R 31/28* (2006.01)

(52) U.S. Cl.
CPC ........ *A24F 47/008* (2013.01); *G01R 31/2803* (2013.01)

(58) Field of Classification Search
CPC ......... A24F 47/00; A24F 47/008; G06F 11/27
See application file for complete search history.

(56) References Cited

U.S. PATENT DOCUMENTS 1,771,366 A 7/1930 Wyss et al.
2,057,353 A 10/1936 Whittemore, Jr.
(Continued)

FOREIGN PATENT DOCUMENTS

AU 276250 7/1965
CA 2 641 869 5/2010
(Continued)

OTHER PUBLICATIONS

International Search Report and Written dated Nov. 4, 2015 for Application No. PCT/US2015/044433.

*Primary Examiner* — Nguyen Ha
(74) *Attorney, Agent, or Firm* — Womble Bond Dickinson (US) LLP

(57) ABSTRACT

The present disclosure relates to a system and related methods, apparatuses, and computer program products for testing components of an aerosol delivery device. For example, a system for testing a control board for an aerosol delivery device may include a control board for an aerosol delivery device and a test apparatus. The test apparatus may provide a test initiation signal to the control board. The control board may execute an onboard diagnostic test to test operation of the control board in response to the test initiation signal. The control board may provide diagnostic information generated based on execution of the onboard diagnostic test to the test apparatus. The test apparatus may determine, based on the diagnostic information, whether the control board is faulty.

17 Claims, 14 Drawing Sheets

(56) References Cited

U.S. PATENT DOCUMENTS

Figure 1:
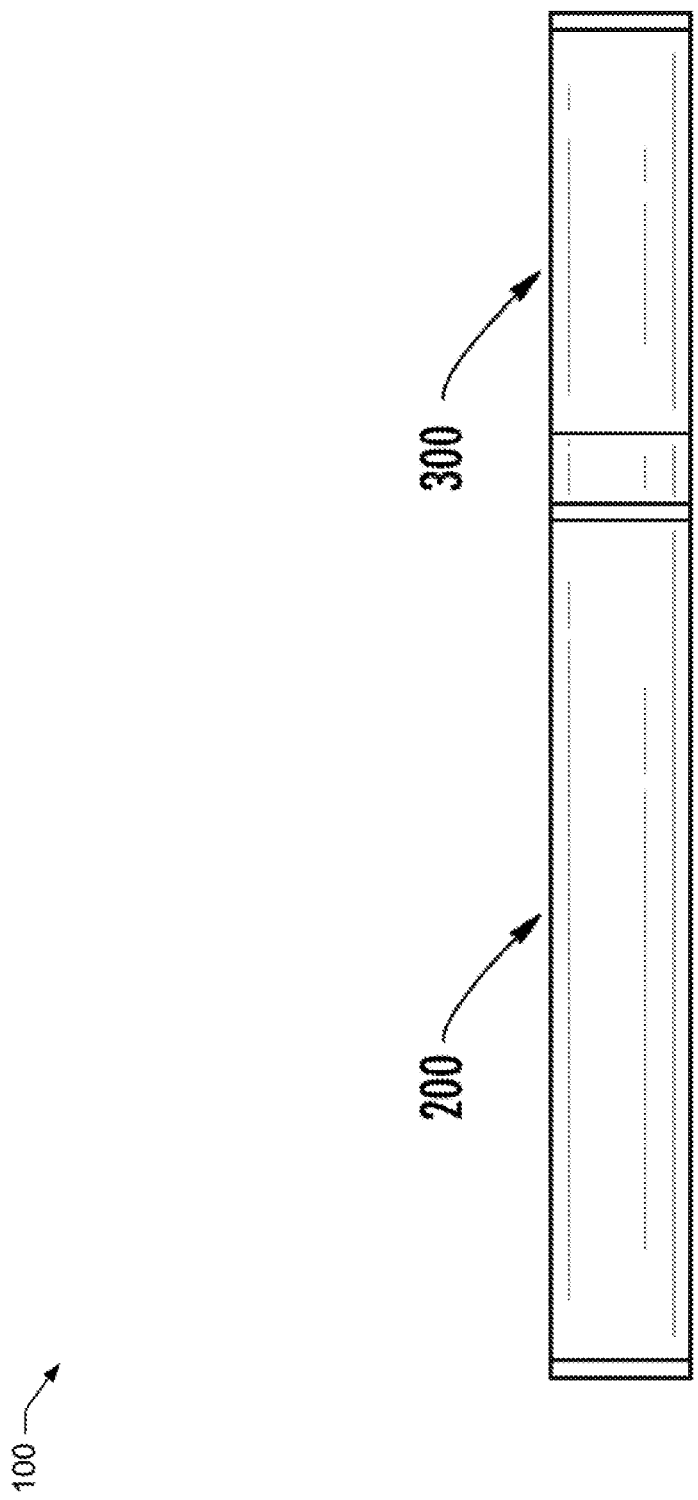

| | | |
|---|---|---|
| 2,104,266 A | 1/1938 | McCormick |
| 3,200,819 A | 8/1965 | Gilbert |
| 4,284,089 A | 8/1981 | Ray |
| 4,303,083 A | 12/1981 | Burruss, Jr. |
| 4,735,217 A | 4/1988 | Gerth et al. |
| 4,848,374 A | 7/1989 | Chard et al. |
| 4,907,606 A | 3/1990 | Lilja et al. |
| 4,922,901 A | 5/1990 | Brooks et al. |
| 4,945,931 A | 8/1990 | Gori |
| 4,947,874 A | 8/1990 | Brooks et al. |
| 4,947,875 A | 8/1990 | Brooks et al. |
| 4,986,286 A | 1/1991 | Roberts et al. |
| 5,019,122 A | 5/1991 | Clearman et al. |
| 5,042,510 A | 8/1991 | Curtiss et al. |
| 5,060,671 A | 10/1991 | Counts et al. |
| 5,093,894 A | 3/1992 | Deevi et al. |
| 5,144,962 A | 8/1992 | Counts et al. |
| 5,249,586 A | 10/1993 | Morgan et al. |
| 5,261,424 A | 11/1993 | Sprinkel, Jr. |
| 5,322,075 A | 6/1994 | Deevi et al. |
| 5,353,813 A | 10/1994 | Deevi et al. |
| 5,369,723 A | 11/1994 | Counts et al. |
| 5,372,148 A | 12/1994 | McCafferty et al. |
| 5,388,574 A | 2/1995 | Ingebrethsen et al. |
| 5,408,574 A | 4/1995 | Deevi et al. |
| 5,468,936 A | 11/1995 | Deevi et al. |
| 5,498,850 A | 3/1996 | Das |
| 5,515,842 A | 5/1996 | Ramseyer et al. |
| 5,530,225 A | 6/1996 | Hajaligol |
| 5,564,442 A | 10/1996 | MacDonald et al. |
| 5,649,554 A | 7/1997 | Sprinkel et al. |
| 5,666,977 A | 9/1997 | Higgins et al. |
| 5,687,746 A | 11/1997 | Rose et al. |
| 5,726,421 A | 3/1998 | Fleischhauer et al. |
| 5,727,571 A | 3/1998 | Meiring et al. |
| 5,799,663 A | 9/1998 | Gross et al. |
| 5,819,756 A | 10/1998 | Mielordt |
| 5,865,185 A | 2/1999 | Collins et al. |
| 5,865,186 A | 2/1999 | Volsey, II |
| 5,878,752 A | 3/1999 | Adams et al. |
| 5,894,841 A | 4/1999 | Voges |
| 5,934,289 A | 8/1999 | Watkins et al. |
| 5,954,979 A | 9/1999 | Counts et al. |
| 5,967,148 A | 10/1999 | Harris et al. |
| 6,040,560 A | 3/2000 | Fleischhauer et al. |
| 6,053,176 A | 4/2000 | Adams et al. |
| 6,089,857 A | 7/2000 | Matsuura et al. |
| 6,095,153 A | 8/2000 | Kessler et al. |
| 6,125,853 A | 10/2000 | Susa et al. |
| 6,155,268 A | 12/2000 | Takeuchi |
| 6,164,287 A | 12/2000 | White |
| 6,196,218 B1 | 3/2001 | Voges |
| 6,196,219 B1 | 3/2001 | Hess et al. |
| 6,243,665 B1 | 6/2001 | Nagoya et al. |
| 6,601,776 B1 | 8/2003 | Oljaca et al. |
| 6,615,840 B1 | 9/2003 | Fournier et al. |
| 6,688,313 B2 | 2/2004 | Wrenn et al. |
| 6,772,756 B2 | 8/2004 | Shayan |
| 6,803,545 B2 | 10/2004 | Blake et al. |
| 6,854,461 B2 | 2/2005 | Nichols |
| 6,854,470 B1 | 2/2005 | Pu |
| 7,117,867 B2 | 10/2006 | Cox et al. |
| 7,293,565 B2 | 11/2007 | Griffin et al. |
| 7,481,226 B2 | 1/2009 | Cholet |
| 7,513,253 B2 | 4/2009 | Kobayashi et al. |
| 7,775,459 B2 | 8/2010 | Martens, III et al. |
| 7,832,410 B2 | 11/2010 | Hon |
| 7,845,359 B2 | 12/2010 | Montaser |
| 7,896,006 B2 | 3/2011 | Hamano et al. |
| 8,127,772 B2 | 3/2012 | Montaser |
| 8,314,591 B2 | 11/2012 | Terry et al. |
| 8,365,742 B2 | 2/2013 | Hon |
| 8,402,976 B2 | 3/2013 | Fernando et al. |
| 8,499,766 B1 | 8/2013 | Newton |
| 8,528,569 B1 | 9/2013 | Newton |
| 8,550,069 B2 | 10/2013 | Alelov |
| 2002/0146242 A1 | 10/2002 | Vieira |
| 2003/0226837 A1 | 12/2003 | Blake et al. |
| 2004/0118401 A1 | 6/2004 | Smith et al. |
| 2004/0129280 A1 | 7/2004 | Woodson et al. |
| 2004/0200488 A1 | 10/2004 | Felter et al. |
| 2004/0226568 A1 | 11/2004 | Takeuchi et al. |
| 2005/0016550 A1 | 1/2005 | Katase |
| 2006/0016453 A1 | 1/2006 | Kim |
| 2006/0196518 A1 | 9/2006 | Hon |
| 2007/0074734 A1 | 4/2007 | Braunshteyn et al. |
| 2007/0102013 A1 | 5/2007 | Adams et al. |
| 2007/0215167 A1 | 9/2007 | Crooks et al. |
| 2008/0085103 A1 | 4/2008 | Beland et al. |
| 2008/0092912 A1 | 4/2008 | Robinson et al. |
| 2008/0257367 A1 | 10/2008 | Paterno et al. |
| 2008/0276947 A1 | 11/2008 | Martzel |
| 2008/0302374 A1 | 12/2008 | Wengert et al. |
| 2009/0006915 A1 | 1/2009 | Gomez et al. |
| 2009/0095311 A1 | 4/2009 | Hon |
| 2009/0095312 A1 | 4/2009 | Herbrich et al. |
| 2009/0126745 A1 | 5/2009 | Hon |
| 2009/0188490 A1 | 7/2009 | Hon |
| 2009/0230117 A1 | 9/2009 | Fernando et al. |
| 2009/0272379 A1 | 11/2009 | Thorens et al. |
| 2009/0283103 A1 | 11/2009 | Nielsen et al. |
| 2009/0320863 A1 | 12/2009 | Fernando et al. |
| 2010/0043809 A1 | 2/2010 | Magnon |
| 2010/0083959 A1 | 4/2010 | Siller |
| 2010/0200006 A1 | 8/2010 | Robinson et al. |
| 2010/0229881 A1 | 9/2010 | Hearn |
| 2010/0242974 A1 | 9/2010 | Pan |
| 2010/0307518 A1 | 12/2010 | Wang |
| 2010/0313901 A1 | 12/2010 | Fernando et al. |
| 2011/0005535 A1 | 1/2011 | Xiu |
| 2011/0011396 A1 | 1/2011 | Fang |
| 2011/0036363 A1 | 2/2011 | Urtsev et al. |
| 2011/0036365 A1 | 2/2011 | Chong et al. |
| 2011/0068820 A1 | 3/2011 | Fox |
| 2011/0094523 A1 | 4/2011 | Thorens et al. |
| 2011/0126848 A1 | 6/2011 | Zuber et al. |
| 2011/0155153 A1 | 6/2011 | Thorens et al. |
| 2011/0155718 A1 | 6/2011 | Greim et al. |
| 2011/0168194 A1 | 7/2011 | Hon |
| 2011/0265806 A1 | 11/2011 | Alarcon et al. |
| 2011/0309157 A1 | 12/2011 | Yang et al. |
| 2012/0042885 A1 | 2/2012 | Stone et al. |
| 2012/0060853 A1 | 3/2012 | Robinson et al. |
| 2012/0111347 A1 | 5/2012 | Hon |
| 2012/0132643 A1 | 5/2012 | Choi et al. |
| 2012/0153974 A1 | 6/2012 | Hashimoto |
| 2012/0227752 A1 | 9/2012 | Alelov |
| 2012/0231464 A1 | 9/2012 | Yu et al. |
| 2012/0260927 A1 | 10/2012 | Liu |
| 2012/0279512 A1 | 11/2012 | Hon |
| 2012/0318882 A1 | 12/2012 | Abehasera |
| 2013/0037041 A1 | 2/2013 | Worm et al. |
| 2013/0056013 A1 | 3/2013 | Terry et al. |
| 2013/0081625 A1 | 4/2013 | Rustad et al. |
| 2013/0081642 A1 | 4/2013 | Safari |
| 2013/0192619 A1 | 8/2013 | Tucker et al. |
| 2013/0306084 A1 | 11/2013 | Flick |
| 2013/0319439 A1 | 12/2013 | Gorelick et al. |
| 2013/0340750 A1 | 12/2013 | Thorens et al. |
| 2013/0340775 A1 | 12/2013 | Juster et al. |
| 2014/0060554 A1 | 3/2014 | Collett et al. |
| 2014/0060555 A1 | 3/2014 | Chang et al. |
| 2014/0096781 A1 | 4/2014 | Sears et al. |
| 2014/0096782 A1 | 4/2014 | Ampolini et al. |
| 2014/0270727 A1 | 9/2014 | Ampolini |
| 2014/0345635 A1 | 11/2014 | Rabinowitz |
| 2015/0020825 A1* | 1/2015 | Galloway ............... G08B 6/00 131/329 |
| 2015/0136153 A1 | 5/2015 | Lord |

FOREIGN PATENT DOCUMENTS

| | | |
|---|---|---|
| CN | 1541577 | 11/2004 |
| CN | 2719043 | 8/2005 |

(56) References Cited

FOREIGN PATENT DOCUMENTS

| | | |
|---|---|---|
| CN | 200997909 | 1/2008 |
| CN | 101116542 | 2/2008 |
| CN | 101176805 | 5/2008 |
| CN | 201379072 | 1/2010 |
| DE | 10 2006 004 484 | 8/2007 |
| DE | 102006041042 | 3/2008 |
| DE | 20 2009 010 400 | 11/2009 |
| EP | 0 295 122 | 12/1988 |
| EP | 0 430 566 | 6/1991 |
| EP | 0 845 220 | 6/1998 |
| EP | 1 618 803 | 1/2006 |
| EP | 2 316 286 | 5/2011 |
| GB | 2469850 | 11/2010 |
| WO | WO 1997/48293 | 12/1997 |
| WO | WO 2004/043175 | 5/2004 |
| WO | WO 2005/099494 | 10/2005 |
| WO | WO 2007/078273 | 7/2007 |
| WO | WO 2007/131449 | 11/2007 |
| WO | WO 2009/105919 | 9/2009 |
| WO | WO 2009/155734 | 12/2009 |
| WO | WO 2010/003480 | 1/2010 |
| WO | WO 2010/045670 | 4/2010 |
| WO | WO 2010/073122 | 7/2010 |
| WO | WO 2010/118644 | 10/2010 |
| WO | WO 2010/140937 | 12/2010 |
| WO | WO 2011/010334 | 1/2011 |
| WO | WO 2012/072762 | 6/2012 |
| WO | WO 2012/100523 | 8/2012 |
| WO | WO 2013/089551 | 6/2013 |

\* cited by examiner

APPARATUSES AND METHODS FOR TESTING COMPONENTS OF AN AEROSOL DELIVERY DEVICE

CROSS-REFERENCE TO RELATED APPLICATION(S)

The present application is a divisional of U.S. patent application Ser. No. 14/464,798, entitled: A System and Related Methods, Apparatuses, and Computer Program Products for Testing Components of an Aerosol Delivery Device, filed on Aug. 21, 2014, the content of which is incorporated herein by reference in its entirety.

FIELD OF THE DISCLOSURE

The present disclosure relates to aerosol delivery devices, such as smoking articles, and more particularly to a system and related methods and computer program products for testing components of an aerosol delivery device. The smoking articles may be configured to heat a material, which may be made or derived from tobacco or otherwise incorporate tobacco, to form an inhalable substance for human consumption.

BACKGROUND

Many smoking devices have been proposed through the years as improvements upon, or alternatives to, smoking products that require combusting tobacco for use. Many of those devices purportedly have been designed to provide the sensations associated with cigarette, cigar, or pipe smoking, but without delivering considerable quantities of incomplete combustion and pyrolysis products that result from the burning of tobacco. To this end, there have been proposed numerous smoking products, flavor generators, and medicinal inhalers that utilize electrical energy to vaporize or heat a volatile material, or attempt to provide the sensations of cigarette, cigar, or pipe smoking without burning tobacco to a significant degree. See, for example, the various alternative smoking articles, aerosol delivery devices and heat generating sources set forth in the background art described in U.S. Pat. No. 7,726,320 to Robinson et al., U.S. Pat. App. Pub. No. 2013/0255702 to Griffith Jr. et al., U.S. Pat. App. Pub. No. 2014/0000638 to Sebastian et al., U.S. Pat. App. Pub. No. 2014/0060554 to Collett et al., U.S. patent application Ser. No. 13/647,000 to Sears et al., filed Oct. 8, 2012, U.S. patent application Ser. No. 13/826,929 to Ampolini et al., filed Mar. 14, 2013, and U.S. patent application Ser. No. 14/011,992 to Davis et al., filed Aug. 28, 2013, which are incorporated herein by reference in their entirety.

Ongoing developments in the field of aerosol delivery devices have resulted in increasingly sophisticated aerosol delivery devices. The increasing sophistication of aerosol delivery devices has resulted in a need for an improved methodology for verifying that manufactured aerosol delivery device components are not faulty prior to distribution to consumers.

SUMMARY OF THE DISCLOSURE

The present disclosure relates to a system and related methods, apparatuses, and computer program products for testing components of an aerosol delivery device. For example, some embodiments provide a control board, such as a printed circuit board or other control board, for an aerosol delivery device that may be configured to execute an onboard diagnostic test for testing operation of the control board. The control board of some such embodiments may be configured to perform the onboard diagnostic test in response to a test initiation signal that may be provided by a test apparatus that may be communicatively coupled with the control board, and may be configured to provide diagnostic information generated based on execution of the onboard diagnostic test to the test apparatus to enable the test apparatus to determine if the control board is faulty. Some such example embodiments may, for example, be used to determine if a manufactured control board is faulty prior to integrating the control board into an aerosol delivery device. The onboard diagnostic test that may be performed by a control board in accordance with some example embodiments may enable more rapid testing of control board operation compared to techniques using a purely external test of component operation. Accordingly, some example embodiments may reduce the incidence of faulty aerosol delivery devices being interjected in the marketplace while also increasing manufacturing throughput.

For example, in one aspect, a system for testing a control board for an aerosol delivery device is provided. The system may include a control board for an aerosol delivery device and a test apparatus. The test apparatus may be configured to provide a test initiation signal to the control board. The control board may be configured to execute an onboard diagnostic test to test operation of the control board in response to the test initiation signal. The control board may be further configured to provide diagnostic information generated based at least in part on execution of the onboard diagnostic test to the test apparatus. The test apparatus may be further configured to determine, based at least in part on the diagnostic information, whether the control board is faulty.

In another aspect, a control board for an aerosol delivery device is provided. The control board may include an interface configured to communicatively couple with a test apparatus. The control board may further include processing circuitry operatively coupled with the interface. The processing circuitry may be configured to cause the control board to execute an onboard diagnostic test to test operation of the control board in response to a test initiation signal received from the test apparatus via the interface. The processing circuitry may be further configured to cause the control board to provide diagnostic information generated based at least in part on execution of the onboard diagnostic test to the test apparatus via the interface.

In a further aspect, a method for testing a control board for an aerosol delivery device is provided. The method may include the control board receiving a test initiation signal from a test apparatus. The method may further include the control board executing an onboard diagnostic test in response to the test initiation signal. The method may additionally include the control board providing diagnostic information generated based at least in part on execution of the onboard diagnostic test to the test apparatus.

In an additional aspect, a computer program product is provided, which may include at least one non-transitory computer-readable storage medium having program instructions stored thereon. The at least one non-transitory computer-readable storage medium may be implemented on a control board for an aerosol delivery device. The stored program instructions may include program code for receiving, to a control board, a test initiation signal from a test apparatus. The stored program instructions may further include program code for executing an onboard diagnostic test in response to the test initiation signal. The stored program instructions may additionally include program code for providing diagnostic information generated based at least in part on execution of the onboard diagnostic test to the test apparatus.

In another aspect, a test apparatus for testing a control board for an aerosol delivery device is provided. The test apparatus may include an interface configured to communicatively couple with the control board. The test apparatus may further include processing circuitry operatively coupled with the interface. The processing circuitry may be configured to cause the test apparatus to provide a test initiation signal to the control board via the interface. The processing circuitry may be further configured to cause the test apparatus to receive, via the interface, diagnostic information from the control board. The processing circuitry may be additionally configured to cause the test apparatus to determine, based at least in part on the diagnostic information, whether the control board is faulty.

In an additional aspect, a method for testing a control board for an aerosol delivery device is provided. The method may include a test apparatus providing a test initiation signal to the control board. The method may further include the test apparatus receiving diagnostic information from the control board. The method may additionally include determining, based at least in part on the diagnostic information, whether the control board is faulty.

In another aspect, a computer program product is provided, which may include at least one non-transitory computer-readable storage medium having program instructions stored thereon. The at least one non-transitory computer-readable storage medium may be implemented on a test apparatus for testing a control board for an aerosol delivery device. The stored program instructions may include program code for providing a test initiation signal to a control board. The stored program instructions may further include program code for receiving, to the test apparatus, diagnostic information from the control board. The stored program instructions may additionally include program code for determining, based at least in part on the diagnostic information, whether the control board is faulty.

In a further aspect, a method for forming an aerosol delivery device is provided. The method may include providing a control board comprising heater circuitry configured to control power delivery to a heating element configured to heat aerosol precursor composition to form an inhalable substance. The method may further include interfacing the control board with a test apparatus configured to identify faulty circuitry in the control board. The method may additionally include combining the control board with a power source within a housing so that the control board includes an electrical connection from the heater circuitry. The electrical connection may be configured for power delivery to the heating element.

This Summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. In this regard, these and other features, aspects, and advantages of the disclosure will be apparent from a reading of the following detailed description together with the accompanying drawings, which are briefly described below. The invention includes any combination of two, three, four, or more of the above-noted embodiments as well as combinations of any two, three, four, or more features or elements set forth in this disclosure, regardless of whether such features or elements are expressly combined in a specific embodiment description herein. This disclosure is intended to be read holistically such that any separable features or elements of the disclosed invention, in any of its various aspects and embodiments, should be viewed as intended to be combinable unless the context clearly dictates otherwise.

BRIEF DESCRIPTION OF THE FIGURES

Having thus described the disclosure in the foregoing general terms, reference will now be made to the accompanying drawings, which are not necessarily drawn to scale, and wherein:

FIG. 1 illustrates a side view of an aerosol delivery device in an assembled configuration, the aerosol delivery device having the general configuration of what can be characterized as an electronic cigarette, and comprising a control body and a cartridge according to some example embodiments of the present disclosure;

FIG. 2 illustrates a side view of the cartridge and a section view through the control body of the aerosol delivery device of FIG. 1 wherein the cartridge is decoupled from the control body according to some example embodiments of the present disclosure;

FIG. 3 illustrates an exploded perspective view of the cartridge of FIG. 1, including a base, a control component terminal, an electronic control component, first and second heating terminals, a flow director, a reservoir substrate, an atomizer, an outer body, a mouthpiece, and a label according to some example embodiments of the present disclosure;

FIG. 4 illustrates an example system for testing a control board for an aerosol delivery device in accordance with some example embodiments of the present disclosure;

FIG. 5 illustrates a block diagram of components that may be implemented on a control board for an aerosol delivery device in accordance with some example embodiments of the present disclosure;

FIG. 6 illustrates a block diagram of an apparatus that may be implemented on a test apparatus in accordance with some example embodiments of the present disclosure;

FIG. 7 illustrates a flowchart according to an example method for testing a control board for an aerosol delivery device that may be performed by the control board in accordance with some example embodiments of the present disclosure;

FIG. 8 illustrates a flowchart according to an example method for testing a control board for an aerosol delivery device that may be performed by a test apparatus in accordance with some example embodiments of the present disclosure;

FIG. 9 illustrates an example control board for an aerosol delivery device in accordance with some example embodiments of the present disclosure;

FIG. 10 illustrates an example test apparatus in accordance with some example embodiments of the present disclosure;

FIGS. 11A-11C illustrate an example method that may be performed by the control board of FIG. 9 and the test apparatus of FIG. 10 for testing the control board of FIG. 9 in accordance with some example embodiments of the present disclosure; and FIG. 12 illustrates an example method for testing components of a fully assembled control body of an aerosol delivery device in accordance with some example embodiments of the present disclosure.

DETAILED DESCRIPTION

The present disclosure will now be described more fully hereinafter with reference to exemplary embodiments thereof. These exemplary embodiments are described so that this disclosure will be thorough and complete, and will fully convey the scope of the disclosure to those skilled in the art. Indeed, the disclosure may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

Some example embodiments of the present disclosure relate to a system and related methods, apparatuses, and computer program products for testing components of an aerosol delivery device. For example, some embodiments provide a control board, such as a printed circuit board or other control board, for an aerosol delivery device that may be configured to execute an onboard diagnostic test for testing operation of the control board. The control board of some such embodiments may be configured to perform the onboard diagnostic test in response to a test initiation signal that may be provided by a test apparatus that may be communicatively coupled with the control board, and may be configured to provide diagnostic information generated based on execution of the onboard diagnostic test to the test apparatus to enable the test apparatus to determine if the control board is faulty. As a further example, some embodiments provide a system comprising a test apparatus and a fully assembled control body for an aerosol delivery that is configured to test operation of components of the control body. Accordingly, various example embodiments may be used to determine if a manufactured control board and/or other component of an aerosol delivery device is faulty prior to distribution and sale of the aerosol delivery device.

Aerosol delivery devices according to the present disclosure are devices that may use electrical energy to heat a material (preferably without combusting the material to any significant degree) to form an inhalable substance; such articles most preferably being sufficiently compact to be considered "hand-held" devices. The aerosol delivery device may not produce smoke in the sense of the aerosol resulting from by-products of combustion or pyrolysis of tobacco, but rather, that the article or device most preferably yields vapors (including vapors within aerosols that can be considered to be visible aerosols that might be considered to be described as smoke-like) resulting from volatilization or vaporization of certain components of the article or device. In highly preferred embodiments, aerosol delivery devices may incorporate tobacco and/or components derived from tobacco. As such, the aerosol delivery device can be characterized as an electronic smoking article such as an electronic cigarette.

Aerosol delivery devices of the present disclosure also can be characterized as being vapor-producing articles or medicament delivery articles. Thus, such articles or devices can be adapted so as to provide one or more substances (e.g., flavors and/or pharmaceutical active ingredients) in an inhalable form or state. For example, inhalable substances can be substantially in the form of a vapor (i.e., a substance that is in the gas phase at a temperature lower than its critical point). Alternatively, inhalable substances can be in the form of an aerosol (i.e., a suspension of fine solid particles or liquid droplets in a gas). For purposes of simplicity, the term "aerosol" as used herein is meant to include vapors, gases and aerosols of a form or type suitable for human inhalation, whether or not visible, and whether or not of a form that might be considered to be smoke-like.

Smoking articles of the present disclosure generally include a number of components provided within an outer shell or body. The overall design of the outer shell or body can vary, and the format or configuration of the outer body that can define the overall size and shape of the smoking article can vary. Typically, an elongated body resembling the shape of a cigarette or cigar can be a formed from a single, unitary shell; or the elongated body can be formed of two or more separable pieces. All of the components of the smoking article may be contained within one outer body or shell, or may be contained within two or more shells that are joined and are separable. For example, a smoking article may possess at one end a control body comprising a shell containing one or more reusable components (e.g., a rechargeable battery and various electronics for controlling the operation of that article), and at the other end and removably attached thereto a shell containing a disposable portion (e.g., a disposable flavor-containing cartridge).

Aerosol delivery devices of the present disclosure most preferably comprise some combination of a power source (i.e., an electrical power source), at least one control component (e.g., means for actuating, controlling, regulating and/or ceasing power for heat generation, such as by controlling electrical current flow from the power source to other components of the aerosol delivery device), a heater or heat generation component (e.g., an electrical resistance heating element or component commonly referred to as part of an "atomizer"), and an aerosol precursor composition (e.g., commonly a liquid capable of yielding an aerosol upon application of sufficient heat, such as ingredients commonly referred to as "smoke juice," "e-liquid" and "e-juice"), and the aerosol delivery devices typically include a mouthend region or tip for allowing draw upon the aerosol delivery device for aerosol inhalation (e.g., a defined air flow path through the article such that aerosol generated can be withdrawn therefrom upon draw).

One example embodiment of an aerosol delivery device 100 according to the present disclosure is illustrated in FIG. 1. As illustrated, the aerosol delivery device 100 may include a control body 200 and a cartridge 300. In this regard, FIG. 1 illustrates the control body 200 and the cartridge 300 respectively in an assembled configuration, wherein the control body and the cartridge are coupled to one another. Various mechanisms may connect the control body 200 to the cartridge 300 to result in a threaded engagement, a press-fit engagement, an interference fit, a magnetic engagement, or the like. A representative design of the aerosol delivery device 100 of some example embodiments is set forth in U.S. Pat. No. D685522 to Potter et al., which is incorporated herein by reference in its entirety.

Figure 2:
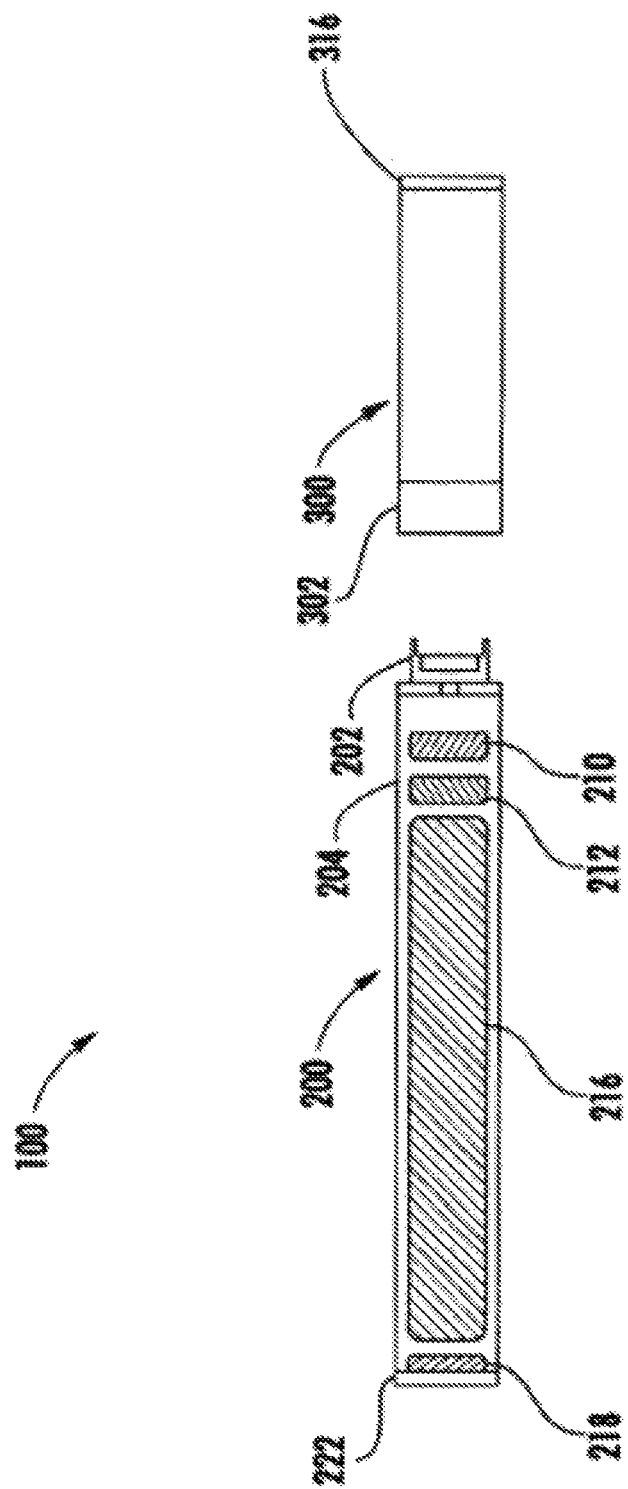

As illustrated in FIG. 2, the control body 200 may comprise a plurality of components. For example, the control body 200 may include a coupler 202, an outer body 204, a flow sensor 210, a control component 212 (which specifically may comprise a control board as further described herein), an electrical power source 216 (e.g., a battery, which may be rechargeable, capacitor, and/or other suitable electrical power source), an indicator 218 (e.g., an LED indicator), and an end cap 222. Various element that may be included in a control body are described in U.S. application Ser. No. 14/193,961 to Worm et al., filed Feb. 28, 2014, which is incorporated herein by reference in its entirety.

Figure 3:
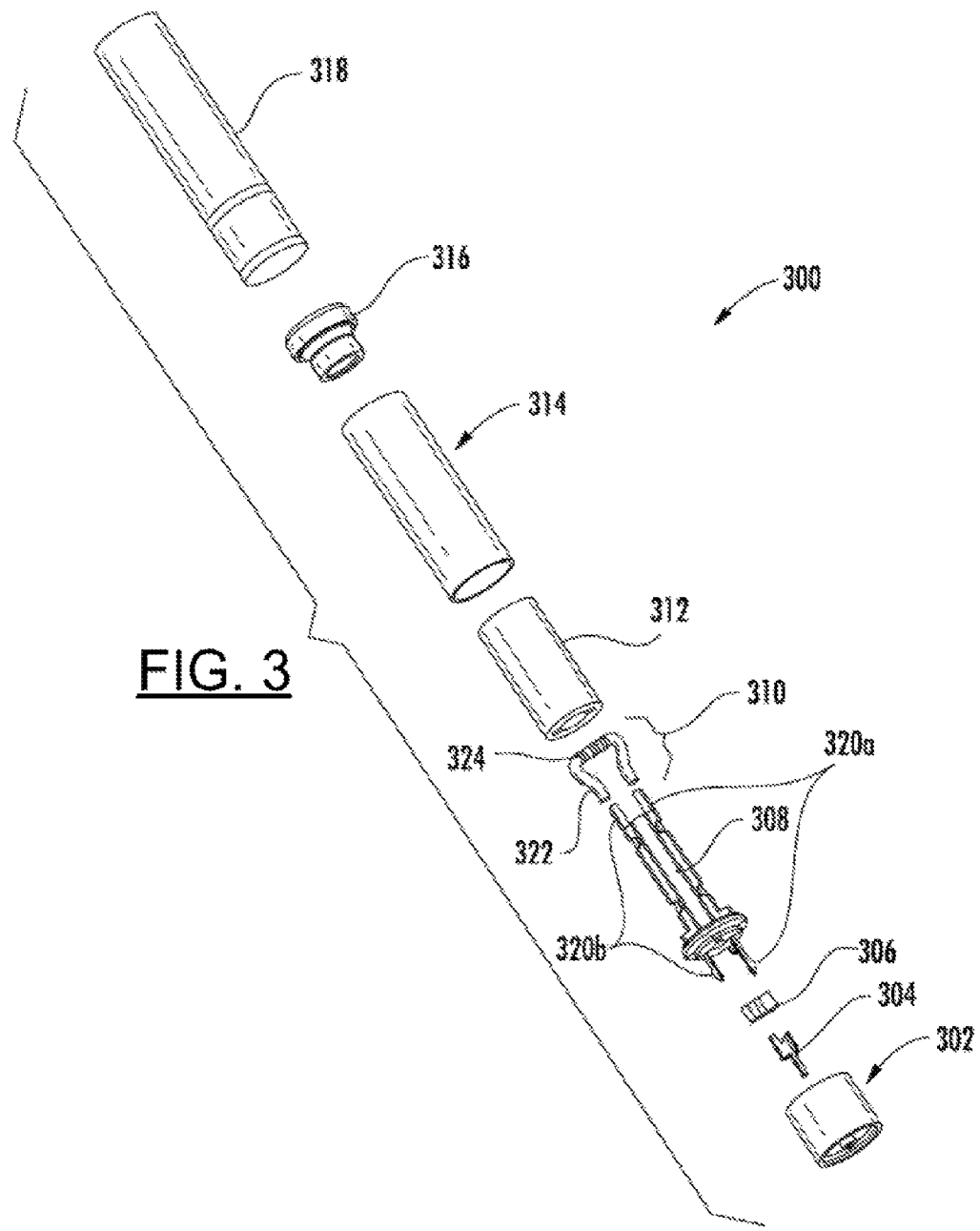

FIG. 3 illustrates an embodiment of a cartridge, such as the cartridge 300, in an exploded configuration. As illustrated, the cartridge 300 may comprise a base 302, a control component terminal 304, an electronic control component 306, a flow director 308, an atomizer 310, a reservoir substrate 312, an outer body 314, a mouthpiece 316, a label 318, and first and second heating terminals 320a, 320b according to an example embodiment of the present disclosure. The atomizer 310 may comprise a liquid transport element 322 and a heating element 324. The cartridge may additionally include a base shipping plug engaged with the base and/or a mouthpiece shipping plug engaged with the mouthpiece in order to protect the base and the mouthpiece and prevent entry of contaminants therein prior to use as disclosed, for example, in U.S. patent application Ser. No. 13/841,233 to Depiano et al., filed Mar. 15, 2013. The description included hereinafter provides example configurations of the above-described components and methods of assembly thereof. However, it should be understood that the cartridge 300 may be assembled in a variety of manners and may include additional or fewer components in other embodiments. For example, although the cartridge 300 is generally described herein as including a reservoir substrate, in other embodiments the cartridge may hold an aerosol precursor composition therein without the use of a reservoir substrate (e.g., through use of a container or vessel that stores the aerosol precursor composition or direct storage therein). In some embodiments, an aerosol precursor composition may be within a container or vessel that may also include a porous (e.g., fibrous) material therein.

It will be appreciated that FIGS. 1-3 are provided by way of example, and not by way of limitation. For example, aerosol delivery devices having other form factors, including non-cylindrical form factors are contemplated within the scope of the disclosure. Moreover, it will be appreciated that other arrangements and configurations of components for forming an aerosol delivery device are contemplated within the scope of disclosure. The various components of an aerosol delivery device according to the present disclosure can be chosen from components described in the art and commercially available. Further examples of aerosol delivery devices and the several components that may be included therein are described in U.S. Publication No. 2013/0037041 to Worm et al., U.S. Publication No. 2014/0000638 to Sebastian et al., U.S. Publication No. 2014/0060554 to Collett et al., U.S. Publication No. 2014/0096781 to Sears et al., U.S. Publication No. 2014/0096782 to Ampolini et al., U.S. application Ser. No. 13/802,950 to Chapman et al., filed Mar. 14, 2013, U.S. application Ser. No. 13/841,233 to DePiano et al., filed Mar. 15, 2013, U.S. application Ser. No. 14/170,838 to Bless et al., filed Feb. 3, 2014, and U.S. application Ser. No. 14/327,776 to Ampolini et al., filed Jul. 10, 2014, which are incorporated herein by reference in their entireties. Aerosol delivery devices in accordance with some example embodiments may be assembled in accordance with methods disclosed in U.S. application Ser. No. 14/227,159 to Ampolini et al., filed Mar. 27, 2014, which is incorporated herein by reference in its entirety.

Having described several example embodiments of aerosol delivery devices that may be used with various example embodiments, several embodiments of a system and related methods, apparatuses, and computer program products for testing components of an aerosol delivery device will now be described.

Figure 4:
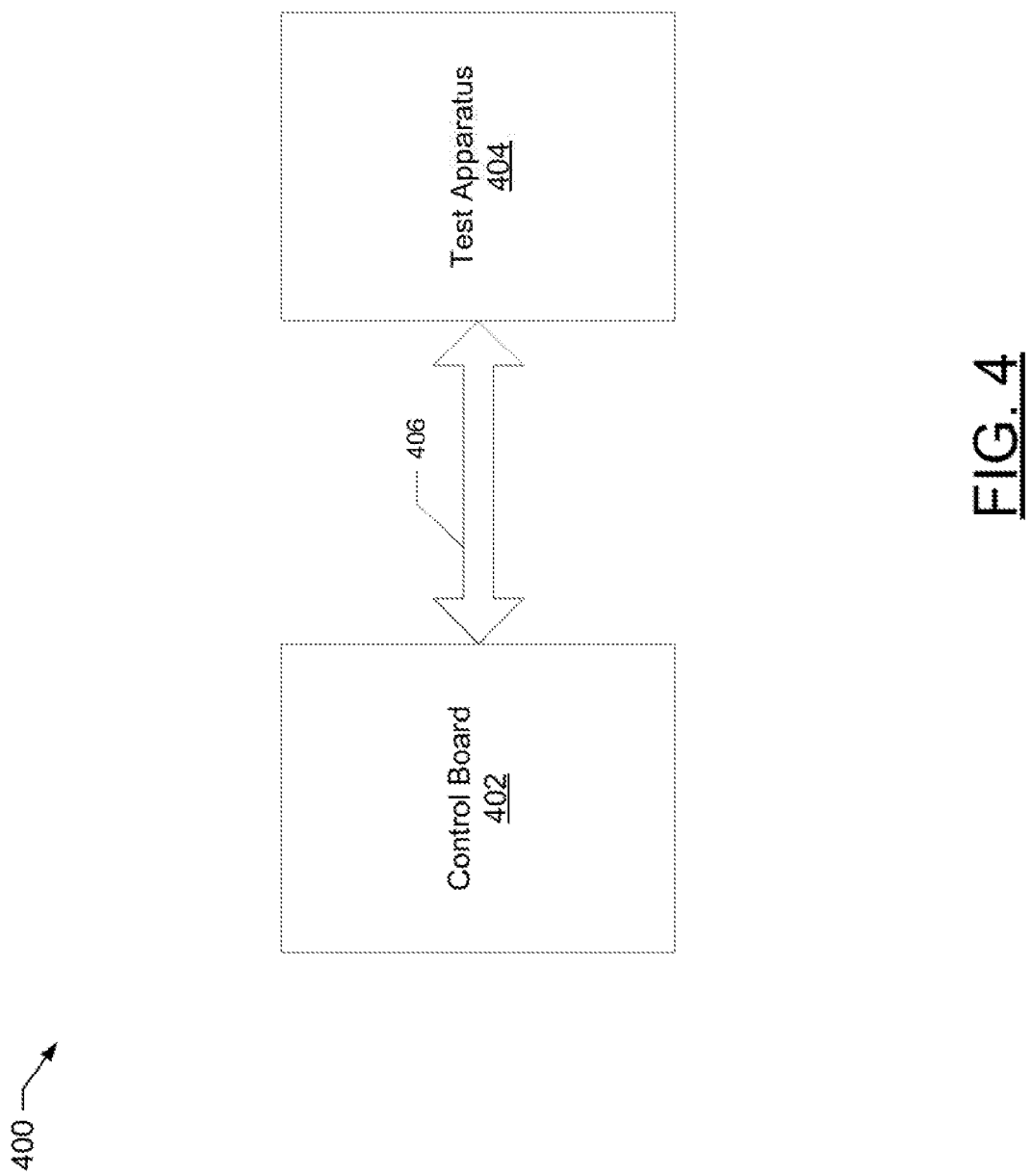

FIG. 4 illustrates an example system 400 for testing a control board for an aerosol delivery device in accordance with some example embodiments of the present disclosure. The system 400 may include a control board 402 for an aerosol delivery device and a test apparatus 404.

The control board 402 may, for example, be configured for implementation within a control body, such as control body 200, of an aerosol delivery device, such as aerosol delivery device 100, in accordance with some example embodiments (see, FIG. 2). In this regard, the control board 402 may carry one or more electronic components (e.g., circuitry) that may be configured to control operation of an aerosol delivery device. For example, the control board 402 may comprise one or more control components (e.g., control component 212 in FIG. 2) that may be configured to monitor, actuate, control, regulate, and/or cease power supply to a heating element that may be used to heat aerosol precursor composition to form an inhalable substance in a fully assembled aerosol delivery device comprising the control board 402.

In some example embodiments, the control board 402 may be at least partially embodied as a printed circuit board (PCB). However, it will be appreciated that other techniques that may be used to form a circuit board and/or other form of control board carrying electronic components may be used to form the control board 402 in addition to or in lieu of PCB construction in accordance with some example embodiments.

The test apparatus 404 may, for example, be embodied as a test fixture or other apparatus that may be configured to communicatively couple with the control board 402 for purposes of facilitating testing the control board 402. In this regard, the control board 402 and test apparatus 404 may comprise respective interfaces that may be configured to communicatively couple with each other to provide the interface 406 during testing of the control board 402. The interface 406 may, for example, be used to pass control signals from the test apparatus 404 to the control board 402. The interface 406 may additionally or alternatively be used to provide diagnostic information from the control board 402 to the test apparatus 404 that may be used by the test apparatus 404 and/or operator thereof to determine whether the control board 402 is faulty. In some example embodiments, the interface 406 may be further configured to supply power from the test apparatus 404 to the control board 402 to power operation of the control board 402 during performance of a diagnostic test.

In some example embodiments, the test apparatus 404 may comprise a "bed of nails" testing interface comprising one or more probes that may be configured to contact one or more corresponding test points that may be implemented on the control board 402 of some example embodiments. Accordingly, in such example embodiments at least some aspects of the interface 406 may be provided by contact between one or more test points of the control board 402 and one or more corresponding probes of the test apparatus 404.

Additionally or alternatively, in some example embodiments, at least some aspects of the interface 406 may be provided by a physical data interface, such as a serial interface, parallel interface, and/or the like. For example, in some embodiments, one of the control board 402 and the test apparatus 404 may include a data port and the other of the control board 402 and the test apparatus 404 may include a corresponding data plug configured to mate with the data port (e.g., via a male to female connection and/or other configuration that may be used to couple a plug and corresponding port to form a data interface). In some such embodiments, the physical data interface may, for example, be formed by a universal serial bus (USB) connection, RS-232 connection, Firewire connection, Thunderbolt connection, and/or the like.

In some example embodiments, at least some aspects of the interface 406 may additionally or alternatively be provided by a wireless communication link between the control board 402 and test apparatus 404. For example, the control board 402 and test apparatus 404 may be configured to communicate via Bluetooth, wireless USB, Zigbee, an Institute of Electrical and Electrical and Electronics Engineers (IEEE) 802.11 technology (e.g., Wi-Fi), Wi-Fi direct, an IEEE 802.15 technology, near field communication (NFC), Infrared Data Association (IrDA) and/or other infrared (IR) technology, and/or other wireless communications technology. In some example embodiments in which the interface 406 comprises a wireless communication link, communication over the communication link may utilize read request techniques disclosed in U.S. application Ser. No. 14/327,776 to Ampolini et al., filed Jul. 10, 2014, which is incorporated herein by reference in its entirety. For example, in accordance with some example embodiments, the test initiation signal described further herein below may comprise a read request as described in U.S. application Ser. No. 14/327,776.

As described further herein below, the test apparatus 404 may be configured to provide a test initiation signal to the control board 402 via the interface 406. The control board 402 may be configured to execute an onboard diagnostic test to test operation of the control board in response to the test initiation signal. For example, the onboard diagnostic test may be used to check for shorts, opens, resistance, capacitance, and and/or other quantities indicative of whether the control board 402 was correctly fabricated. The control board 402 may be further configured to provide diagnostic information generated based at least in part on execution of the onboard diagnostic test to the test apparatus 404 via the interface 406. The test apparatus 404 and/or an operator thereof may use the diagnostic information to determine if the control board 402 is faulty.

Although a single control board 402 is illustrated by way of example in FIG. 4, it will be appreciated that in some embodiments, the test apparatus 404 may be configured to concurrently test operation of multiple control boards 402. For example, the test apparatus 404 of some example embodiments may be configured to test a panel comprising a plurality of control boards 402.

Figure 5:
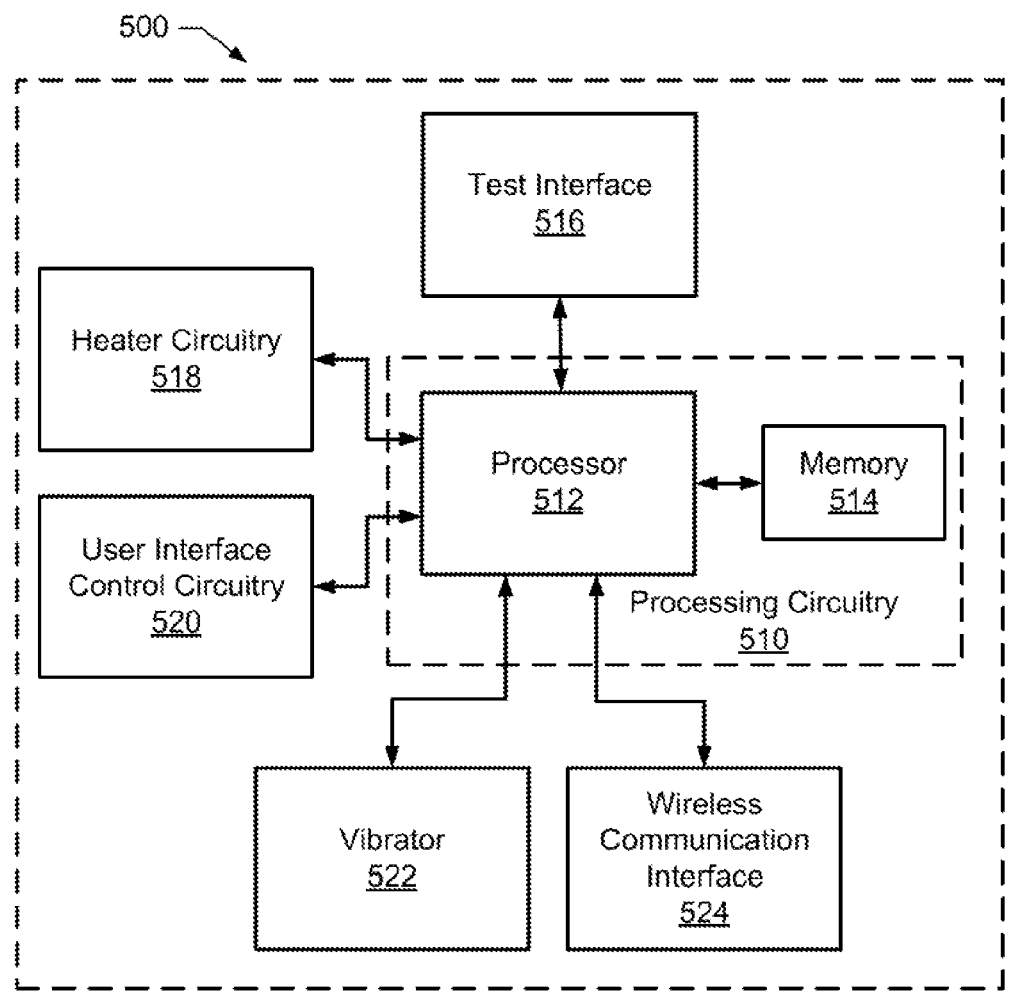

FIG. 5 illustrates a block diagram of components that may be implemented on a control board, such as control board 402, for an aerosol delivery device in accordance with some example embodiments of the present disclosure. In this regard, FIG. 5 illustrates an apparatus 500 that may be implemented on a control board in accordance with some example embodiments. It will be appreciated that the components, devices or elements illustrated in and described with respect to FIG. 5 below may not be mandatory and thus some may be omitted in certain embodiments. Additionally, some embodiments may include further or different components, devices or elements beyond those illustrated in and described with respect to FIG. 5.

In some example embodiments, the apparatus 500 may include processing circuitry 510 that is configurable to perform functions in accordance with one or more example embodiments disclosed herein. In this regard, the processing circuitry 510 may be configured to perform and/or control performance of one or more functionalities of a control board, such as control board 402 in accordance with various example embodiments. Thus, the processing circuitry 510 may be configured to perform data processing, application execution and/or other processing and management services according to one or more example embodiments. For example, the processing circuitry 510 may be configured to execute an onboard diagnostic test in accordance with various embodiments.

In some embodiments, the apparatus 500 or a portion(s) or component(s) thereof, such as the processing circuitry 510, may be implemented via one or more integrated circuits, which may each include one or more chips. The processing circuitry 510 and/or one or more further components of the apparatus 500 may therefore, in some instances, be configured to implement an embodiment on a system on a chip.

In some example embodiments, the processing circuitry 510 may include a processor 512 and, in some embodiments, such as that illustrated in FIG. 5, may further include memory 514. The processing circuitry 510 may be in communication with or otherwise control a test interface 516, heater circuitry 518, user interface control circuitry 520, vibrator 522, and/or wireless communication interface 524.

The processor 512 may be embodied in a variety of forms. For example, the processor 512 may be embodied as various hardware processing means, such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 512 may comprise a plurality of processors. The plurality of processors may be in operative communication with each other and may be collectively configured to perform one or more functionalities of the control board 402. In some example embodiments, the processor 512 may be configured to execute instructions that may be stored in the memory 514 and/or that may be otherwise accessible to the processor 512. For example, in some embodiments, the processor 512 may be configured to execute software for performing an onboard diagnostic test in accordance with various embodiments. As such, whether configured by hardware or by a combination of hardware and software, the processor 512 may be capable of performing operations according to various embodiments while being configured accordingly.

In some example embodiments, the memory 514 may include one or more memory devices. Memory 514 may include fixed and/or removable memory devices. In some embodiments, the memory 514 may provide a non-transitory computer-readable storage medium that may store computer program instructions that may be executed by the processor 512. In this regard, the memory 514 may be configured to store information, data, applications, instructions and/or the like for enabling the apparatus 500 to carry out various functions in accordance with one or more example embodiments. For example, the memory 514 may store instructions for performing an onboard diagnostic test in accordance with various embodiments. In some embodiments, the memory 514 may be in communication with one or more of the processor 512, test interface 516, user interface control circuitry 520, and read control module 520 via one or more buses for passing information among components of the apparatus 500.

The apparatus 500 may further include a test interface 516. The test interface 516 may be configured to communicatively couple with a corresponding test interface of the test apparatus 404 (e.g., the test interface 616 illustrated in and described below with respect to FIG. 6) to provide the interface 406. In some example embodiments, the test interface 516 may provide a connection via which power for powering operation of the control board 402 during performance of an onboard diagnostic test may be received from the test apparatus 404.

The test interface 516 may, for example, include one or more test points that may be configured to contact one or more corresponding probes of the test apparatus 404 of some example embodiments. As another example, the test interface 516 may include a physical data port and/or data plug, which may be used to enable data communication between the control board 402 and test apparatus 404, such as via a USB connection, RS-232 connection, Firewire connection, Thunderbolt connection, and/or the like. As a further example, in some embodiments in which wireless communication may be used to support communication of a test initiation signal, diagnostic information, and/or other data between the control board 402 and the test apparatus 404, the test interface 516 may include and/or otherwise utilize aspects of the wireless communication interface 524 described further herein below.

In some example embodiments, the apparatus 500 may include heater circuitry 518. The heater circuitry 518 may be at least partially embodied as various means, such as circuitry, hardware, a computer program product comprising computer readable medium (for example, the memory 514) storing computer readable program instructions executable by a processing device (for example, the processor 512), or some combination thereof. In some embodiments, the processor 512 (or the processing circuitry 510) may include, or otherwise control, the heater circuitry 518. When a control board, such as control board 402, including the apparatus 500 is implemented in a control body (e.g., control body 200) for an aerosol delivery device (e.g., aerosol delivery device 100), the heater circuitry 518 may be configured to operatively engage a heating element (e.g., heating element 324) via one or more electrical connections, the heating element being implemented in a cartridge (e.g., cartridge 300) or being implemented in the same housing as the apparatus 500. For example, the heater circuitry 518 may be configured to operatively engage the first and second heating terminals 320*a*, 320*b* to supply electrical current to the heating element 324 in accordance with some example embodiments. The heater circuitry 518 may accordingly be configured to control the supply of power to a heating element (e.g., heating element 324) for heat generation.

In some example embodiments, the apparatus 500 may include the user interface control circuitry 520. The user interface control circuitry 520 may be at least partially embodied as various means, such as circuitry, hardware, a computer program product comprising computer readable medium (for example, the memory 514) storing computer readable program instructions executable by a processing device (for example, the processor 512), or some combination thereof. In some embodiments, the processor 512 (or the processing circuitry 510) may include, or otherwise control, the user interface control circuitry 520. The user interface control circuitry 520 may be configured to control operation of an input mechanism(s) to enable a user to power the aerosol delivery device on/off, to activate a heating element to generate a vapor or aerosol for inhalation, and/or to otherwise actuate and/or control at least some functionality of an aerosol delivery device. For example, the user interface control circuitry 520 may comprise and/or may be configured to receive signals from a puff sensing component (e.g., flow sensor 210) that may be configured to detect a puff input to an aerosol delivery device. As another example, the user interface control circuitry 520 may comprise indicator control circuitry, such as LED control circuitry, be configured to control operation of one or more LEDs and/or other indicator(s) (e.g., indicator 218) that may be used to indicate an operating status of an aerosol delivery device charge level of a battery, an amount of aerosol precursor composition remaining in a cartridge, and/or to provide other status information that may be related to operation of an aerosol delivery device to a user. For example, the user interface control circuitry 520 may comprise indicator control circuitry that may be configured to activate/deactivate an indicator, control a level of illumination of an indicator, control a color of illumination of an indicator, and/or control another characteristic of an indicator.

In some example embodiments, the apparatus 500 may include a vibrator 522. It will be appreciated, however, that in some example embodiments, the vibrator 522 may be omitted. The vibrator 522 may comprise a motor and/or other electro-mechanical device that may be configured to impart a vibration and/or other motion on an aerosol delivery device including the vibrator 522. For example, the vibrator 522 may be configured to function as a haptic feedback device during usage of an aerosol delivery device.

In some example embodiments, the apparatus 500 may include a wireless communication interface 524. It will be appreciated, however, that in some example embodiments, the wireless communication interface 524 may be omitted. The test interface 516 may be configured to enable the control board 402 and/or an aerosol delivery device including the control board 402 to wireless communicate with another computing device and/or over a wireless communication network. In some example embodiments in which at least some aspects of the interface 406 may be provided by a wireless communication link between the control board 402 and test apparatus 404, at least some aspects of the test interface 516 may be provided by the wireless communication interface 524. The wireless communication interface 524 may include, for example, an antenna (or multiple antennas) and supporting hardware and/or software for enabling communications with a wireless communication network (e.g., a cellular network, wireless local area network, wireless personal area network, and/or the like) and/or for supporting a wireless communication link with a second computing device. Thus, for example, the wireless communication interface 524 may be configured to support various wireless communication technologies, such as by way of non-limiting example, various Bluetooth technologies, Zigbee, wireless USB, various IEEE 802.15 technologies, various IEEE 802.11 technologies, IrDA and/or other IR technology, NFC, and/or other communication technologies that may be used to support wireless communication between two or more computing devices.

FIG. 6 illustrates a block diagram of an apparatus 600 that may be implemented on a test apparatus, such as test apparatus 404, in accordance with some example embodiments of the present disclosure. It will be appreciated that the components, devices or elements illustrated in and described with respect to FIG. 6 below may not be mandatory and thus some may be omitted in certain embodiments. Additionally, some embodiments may include further or different components, devices or elements beyond those illustrated in and described with respect to FIG. 6.

In some example embodiments, the apparatus 600 may include processing circuitry 610 that is configurable to perform and/or control performance of functions of the test apparatus 404 in accordance with one or more example embodiments disclosed herein. Thus, the processing circuitry 610 may be configured to perform data processing, application execution and/or other processing and management services that may be implemented to perform functionality of the test apparatus 404 according to one or more example embodiments.

In some embodiments, the apparatus 600 or a portion(s) or component(s) thereof, such as the processing circuitry 610, may be implemented via one or more integrated circuits, which may each include one or more chips. The processing circuitry 610 and/or one or more further components of the apparatus 600 may therefore, in some instances, be configured to implement an embodiment on a system on a chip.

Figure 6:
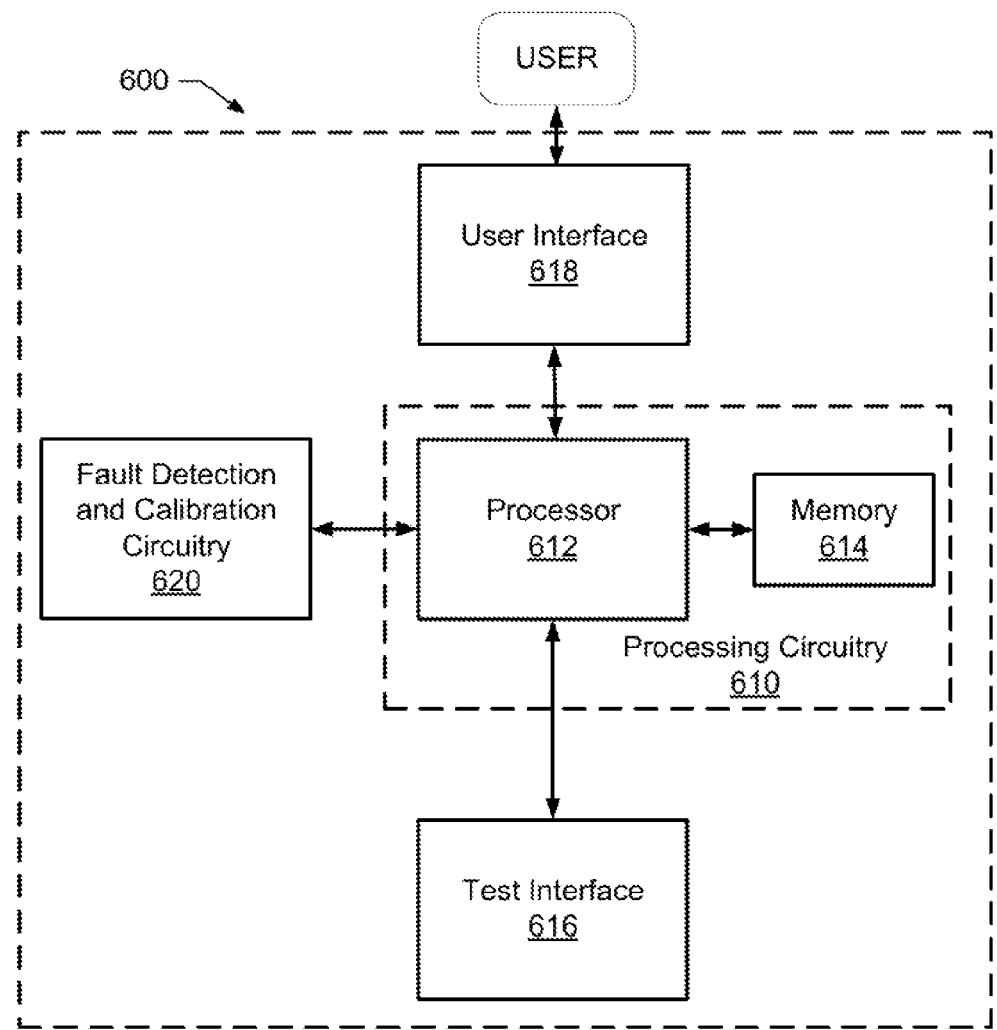

In some example embodiments, the processing circuitry 610 may include a processor 612 and, in some embodiments, such as that illustrated in FIG. 6, may further include memory 614. The processing circuitry 610 may be in communication with or otherwise control the test interface 616, user interface 618, and/or fault detection and calibration circuitry 620.

The processor 612 may be embodied in a variety of forms. For example, the processor 612 may be embodied as various hardware processing means, such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 612 may comprise a plurality of processors. The plurality of processors may be in operative communication with each other and may be collectively configured to perform one or more functionalities of a test apparatus, such as the test apparatus 404, in accordance with various embodiments. In some example embodiments, the processor 612 may be configured to execute instructions that may be stored in the memory 614 and/or that may be otherwise accessible to the processor 612. As such, whether configured by hardware or by a combination of hardware and software, the processor 612 may be capable of performing operations according to various embodiments while being configured accordingly.

In some example embodiments, the memory 614 may include one or more memory devices. Memory 614 may include fixed and/or removable memory devices. In some embodiments, the memory 614 may provide a non-transitory computer-readable storage medium that may store computer program instructions that may be executed by the processor 612. In this regard, the memory 614 may be configured to store information, data, applications, instructions and/or the like for enabling the apparatus 600 to carry out various functions in accordance with one or more example embodiments. In some embodiments, the memory 614 may be in communication with one or more of the processor 612, test interface 616, user interface 618, and fault detection and calibration circuitry 620 via one or more buses for passing information among components of the apparatus 600.

The apparatus 600 may further include a test interface 616. The test interface 616 may be configured to communicatively couple with a corresponding test interface of the control board 402 (e.g., the test interface 516 illustrated in and described above with respect to FIG. 5) to provide the interface 406 during testing of the control board 402. In this regard, the test interface 616 may be configured to facilitate communication with the control board 402. The test interface 616 may be further configured to provide the control board 402 a connection to circuitry of the test apparatus 404 (e.g., aspects that may be provided by the fault detection and calibration circuitry 620 of some example embodiments) that may be used by the control board 402 to test operation of one or more aspects of the control board 402. In some example embodiments, the test interface 616 may be configured to provide power to the control board 402 during execution of an onboard diagnostic test by the control board 402.

The test interface 616 may, for example, include one or more probes that may be configured to contact one or more corresponding test points of the control board 402 of some example embodiments. As another example, the test interface 616 may include a physical data port and/or data plug, which may be used to enable data communication between the test apparatus 404 and control board 402, such as via a USB connection, RS-232 connection, Firewire connection, Thunderbolt connection, and/or the like.

As a further example, in some embodiments in which wireless communication may be used to support communication of a test initiation signal, diagnostic information, and/or other data between the control board 402 and the test apparatus 404, the test interface 616 may include a wireless communication interface. In such embodiments, the test interface 616 may include, for example, an antenna (or multiple antennas) and supporting hardware and/or software for enabling communications with a wireless communication network (e.g., a cellular network, wireless local area network, wireless personal area network, and/or the like) and/or for supporting a wireless communication link with a second computing device. For example, in such embodiments, the test interface 616 may be configured to support various wireless communication technologies, such as by way of non-limiting example, various Bluetooth technologies, Zigbee, wireless USB, various IEEE 802.15 technologies, various IEEE 802.11 technologies, IrDA and/or other IR technology, NFC, and/or other communication technologies that may be used to support wireless communication between two or more computing devices.

In some example embodiments, the apparatus 600 may include the user interface 618. However, in some embodiments, one or more aspects of the user interface 618 may not be present, or the user interface 618 may be eliminated entirely. The user interface 618 may be in communication with the processing circuitry 610 to receive an indication of a user input and/or to provide an audible, visual, mechanical, or other output to a user. As such, the user interface 618 may include, for example, a keyboard, a mouse, a joystick, a display, a touch screen display, a microphone, a speaker, one or more biometric input devices (e.g., a visual or sensorial tracing device that may track body part or eye movements), an accelerometer, a gyroscope, and/or other input/output mechanisms. In embodiments wherein the user interface 618 comprises a touch screen display, the user interface 618 may additionally be configured to detect and/or receive an indication of a touch and/or other movement gesture or other input to the display.

The user interface 618 may be configured to provide an indication of diagnostic results from an onboard diagnostic test that may be performed by a control board 402 in accordance with various example embodiments. For example, the user interface 618 may be configured to indicate if a control board 402 is faulty. In some such embodiments, if a fault has been detected in the control board 402, an indication of a component of the control board 402 that has been determined to be faulty may be provided. For example, an indicator light, a message on a display, and/or other indication may be used to indicate whether a fault is detected in a control board 402. For example, the user interface 618 of some embodiments may include one or more LEDs and/or other indicators that may be configured to illuminate in response to test operations that may be performed by the control board 402 during execution of an onboard diagnostic test by a control board 402 to provide an operator of the test apparatus 404 a visual indication of whether a fault is present in the control board 402.

In some example embodiments, the user interface 618 may include user interface elements approximating user interface elements of a fully assembled aerosol delivery device so as to enable testing aspects of the user interface control circuitry 520 when the control board 402 is communicatively coupled with the test apparatus 404 via interface 406 during execution of an onboard diagnostic test by the control board 402. For example, the user interface 618 of some example embodiments may include one or more LEDs that may be operatively coupled with LED control circuitry (e.g., as may be provided by the user interface control circuitry 520) via the interface 406 during execution of an onboard diagnostic test such that an operator of the test apparatus 404 may verify proper operation of the LED control circuitry by determining if an LED of the user interface 618 is illuminated during testing of the LED control circuitry.

The apparatus 600 may further include fault detection and calibration circuitry 620. The fault detection and calibration circuitry 620 may be embodied as various means, such as circuitry, hardware, a computer program product comprising computer readable medium (for example, the memory 614) storing computer readable program instructions executable by a processing device (for example, the processor 612), or some combination thereof. In some embodiments, the processor 612 (or the processing circuitry 610) may include, or otherwise control, the fault detection and calibration circuitry 620.

In some example embodiments, the fault detection and calibration circuitry 620 may be configured to generate a test initiation signal and provide the test initiation signal to the control board 402 to invoke execution of an onboard diagnostic test by the control board 402. The fault detection and calibration circuitry 620 may be further configured to use diagnostic information that may be provided by the control board 402 based on execution of the diagnostic test to determine whether the control board 402 is faulty.

In some example embodiments, the fault detection and calibration circuitry 620 may include circuitry, such as resistance loads, loopback paths, and/or the like that may be operatively coupled with the control board 402 (e.g., via interface 406) during execution of a diagnostic test to enable the control board 402 to test operation of one or more aspects of the control board 402. For example, a loopback, or return, path may couple two test or more points of the control board 402 of some example embodiments via circuitry that may be provided by the fault detection and calibration circuitry 620.

The fault detection and calibration circuitry 620 may additionally or alternatively include measurement circuitry that may be configured to measure diagnostic data that may be provided by the control board 402 during execution of a diagnostic test. For example, the fault detection and calibration circuitry 620 of some example embodiments may include an ohmmeter, voltmeter, and/or the like.

The control board 402 may apply power and/or a current to one or more test points connected by a loopback path to test operation of a portion of the control board 402. The control board 402 (e.g., the processing circuitry 510) may test operation of the control board 402 by measuring a voltage across test points, measuring a current flowing to a test point of the control board 402 via the return path, and/or the like. The control board 402 (e.g., the processing circuitry 510) may determine if there is a fault in a portion of the control board 402 by comparing a measured value to an expected criterion. For example, the control board 402 may compare a measured current value flowing via a return path to the control board 402 to an expected current criterion. If the measured current is equal to an expected current value and/or is within a range of current values indicating proper operation, the control board 402 may determine that there is not a fault in a component being tested. However, if the measured current does not satisfy the expected current criterion such that the measured current does not equal an expected current value and/or is not within a range of current values indicating proper operation, the control board 402 may determine that there is a fault in the component being tested. As another example, the control board 402 may compare a measured voltage across test points to an expected voltage criterion. If the measured voltage is equal to an expected voltage value and/or is within a range of voltage values indicating proper operation, the control board 402 may determine that there is not a fault in a component being tested. However, if the measured voltage does not satisfy the expected voltage criterion such that the measured voltage does not equal an expected voltage value and/or is not within a range of voltage values indicating proper operation, the control board 402 may determine that there is a fault in the component being tested.

As a particular example, the fault detection and calibration circuitry 620 of some example embodiments may include a resistance load configured to operatively couple with the heater circuitry 518 during execution of a diagnostic test by the control board 402. In some such example embodiments, the resistance load may be operatively coupled with the heater circuitry 518 via a connection between one or more test points that may be implemented on the control board 402 and one or more corresponding probes that may be implemented on the test apparatus 404 in accordance with some example embodiments. The resistance load may be configured to emulate a resistance of a heating element (e.g., heating element 324 in FIG. 3). The processing circuitry 510 of some example embodiments may be configured to test operation of heater circuitry 518 by activating the heater circuitry 518 to provide power to the resistance load via a connection to the resistance load of the test apparatus 404 and measuring a current flowing through a path between the resistance load and the heater circuitry 518. The processing circuitry 510 may be configured to verify that the measured current satisfies an expected current criterion, such as by equaling an expected current value and/or falling within an expected range of current values. If the measured current does not satisfy the expected current criterion, the processing circuitry 510 may determine that there is a fault in the heater circuitry 518.

In some example embodiments, the fault detection and calibration circuitry 620 may be configured to simulate a puff input to the control board 402. For example, in some embodiments, such as that illustrated in and described below with respect to FIGS. 9-11C, the fault detection and calibration circuitry 620 may be configured to simulate a puff input by applying a charge and/or current to a test point corresponding to puff detection circuitry of the control body 402 of some example embodiments. For example, the puff detection circuitry of such embodiments may be configured to operatively couple to a puff detection sensor (e.g., flow sensor 210 in FIG. 2) that may be configured to generate an electrical output in response to a puff input. As another example, the fault detection and calibration circuitry 620 may be configured to simulate a pressure drop that may occur when a user puffs on a fully assembled aerosol delivery device comprising the control board 402 of some example embodiments so as to trigger a pressure drop that may be detectable by a puff detection sensor (e.g., flow sensor 210) that may be implemented on the control board 402 of some such embodiments.

The control board 402 (e.g., processing circuitry 510) may be configured to respond to a simulated puff input during execution of an onboard diagnostic test by testing performance of at least one operation that the control board 402 may be configured to perform in response to a puff input to an aerosol delivery device (e.g., aerosol delivery device 100 in FIG. 1) comprising the control board 402. For example, in some embodiments, the control board 402 may be configured to activate and test operation of the heater circuitry 518 in response to a simulated puff input. As another example, in some embodiments the user interface control circuitry 520 may be configured to activate an indicator (e.g., an LED or other indicator) in response to a puff input to indicate that aerosol precursor composition is being consumed (e.g., by heating the aerosol precursor composition to form an inhalable substance). Accordingly, in some such embodiments, the control board 402 may be configured to test operation of one or more aspects of the user interface control circuitry 420 in response to a simulated puff input.

In some example embodiments, the fault detection and calibration circuitry 620 and/or processing circuitry 510 may be configured to calibrate one or more components of the control board 402 based at least in part on diagnostic information derived based on a test(s) that may be performed by the control board 402 in accordance with various example embodiments. In this regard, the fault detection and calibration circuitry 620 of some example embodiments may be configured to determine if a component of the control board 402 requires calibration based on diagnostic information that may be provided by the control board 402. For example, an aspect of the heater circuitry 518, such as a current sensing resistor that may be used to determine and/or otherwise regulate a power output that may be supplied to a heating element may be calibrated based on diagnostic information. The calibration may, for example, include calibration of an offset from a default (e.g., a plus or minus offset). As a further example, calibration may include calibrating a heating temperature for heating aerosol precursor, calibrating a battery measurement component that may be used to measure remaining power, and/or other components that may be calibrated based on diagnostic information derived during performance of a diagnostic test. Accordingly, in accordance with some example embodiments, a fault and/or determination that operation of the control board 402 is outside of an expected range may be addressed through performance of a calibration routine by the calibration circuitry 620 and/or processing circuitry 510 that may be used to calibrate control software that may be implemented on the control board 402.

In some example embodiments, the test apparatus 404 may be configured to maintain performance data, such as failure types, failure rates, and/or the like that may be derived and/or aggregated based on diagnostic data from tested control boards 402. In some such example embodiments, the performance data may be maintained locally, such as on memory 614. Additionally or alternatively, in some example embodiments, the test apparatus 404 may be in communication with an external computing device and/or external storage via a physical connection and/or via network communication. In some such example embodiments, the test apparatus 404 may provide diagnostic information and/or performance data received from and/or otherwise derived based on a tested control board(s) 402 for remote storage.

Figure 7:
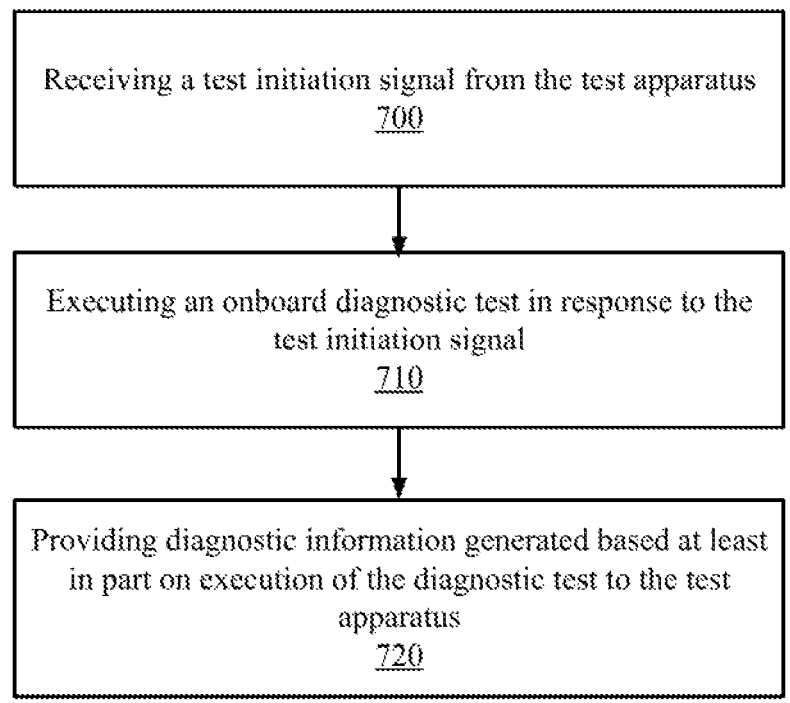

FIG. 7 illustrates a flowchart according to an example method for testing a control board, such as control board 402, for an aerosol delivery device. More particularly, FIG. 7 illustrates a method that may be performed by a control board, such as control board 402, in accordance with some example embodiments of the present disclosure. Accordingly, one or more elements of the apparatus 500, such as one or more of processing circuitry 510, processor 512, memory 514, test interface 516, heater circuitry 518, user interface control circuitry 520, vibrator 522, and wireless communication interface 524 may, for example, provide means for performing one or more of the operations illustrated in and described with respect to FIG. 7.

Operation 700 may include receiving a test initiation signal from the test apparatus 404. The test initiation signal may be received via the interface 406. In some example embodiments, the test initiation signal may be a digital signal. For example, in some such embodiments, the digital signal may be received via a physical communication path, such as may be provided via a serial interface, between the control board 402 and test apparatus 404. As another example, in some embodiments, the digital signal may comprise a digital command that may be wirelessly transmitted by the test apparatus 404 and received by the control board 402 (e.g., via the wireless communication interface 524). Alternatively, in some example embodiments, the test initiation signal may comprise an analog signal, such as a current and/or voltage that may be applied by the test apparatus 404 to a test point(s) that may be implemented on the control board 402 of some example embodiments.

Operation 710 may include executing an onboard diagnostic test in response to the test initiation signal. The onboard diagnostic test may comprise one or more tests for testing operation of the control board 402. For example, in some embodiments, operation 710 may include testing operation of the heater circuitry 518. As a further example, in some embodiments, operation 710 may include testing operation of user interface control circuitry 520. For example, the diagnostic test may include testing operation of LED control circuitry that may be provided by the user interface control circuitry 520 of some example embodiments. As an additional example, in embodiments including vibrator 722, operation 710 may include testing operation of the vibrator 722. As still a further example, in embodiments including wireless communication interface 524, operation 710 may include testing operation of the wireless communication interface 524. In some example embodiments, one or more tests that may be performed attendant to performance of operation 710 may be performed in response to a simulated puff input that may be provided by the test apparatus 404.

In accordance with some example embodiments, operation 710 may include performing a series of diagnostic tests in a defined order. If one of the tests fails, the control board 402 may terminate execution of the onboard diagnostic test prior to completion of any of the series of diagnostic tests remaining to be performed. In this regard, in such embodiments, the control board 402 may be deemed faulty if a fault is identified by any of the series of diagnostic tests. In some such embodiments, the first of the series of diagnostic tests may be a test configured to test a component of the control board 402 considered to be a "hardest failure" (e.g., a component considered to be most critical for proper operation of the control board 402). For example, in some embodiments, operation of the heater circuitry 518 may be tested first since operation of an aerosol delivery device may be reliant on proper operation of the heater circuitry 518.

Operation 720 may include providing diagnostic information generated based at least in part on execution of the diagnostic test to the test apparatus. The diagnostic information may be indicative of whether a fault has been detected via a diagnostic test such that the test apparatus 404 may determine if the control board 402 is faulty.

In some example embodiments, the control board 402 (e.g., the processing circuitry 510) may be configured to evaluate results of a diagnostic test to determine if a fault is present and may provide the test apparatus 404 with a value and/or other information indicative of whether the control board 402 determined presence of a fault. For example, the diagnostic information may comprise a binary value, Boolean Value, and/or other value/information that may be used to indicate either that (1) a fault condition was detected; or (2) a diagnostic test was passed.

In some embodiments in which the control board 402 may be configured to evaluate results of a diagnostic test to determine if a fault is present, the control board 402 may be configured to measure a value, such as a voltage and/or current, that may be generated by the test and may compare the measured value to an expected criterion to determine if the expected criterion is satisfied. For example, a diagnostic test may include activating a component that may be implemented on the control board 402 and measuring a voltage across a connection between two test points that may be provided by the fault detection and calibration circuitry 620 and/or measuring a current that may flow via a return path to the control board 402 that may be provided by the fault detection and calibration circuitry 620 as described above. The control board 402 may then generate diagnostic information indicating whether the measured value satisfied the expected criterion and may provide the diagnostic information to the test apparatus 404.

Additionally or alternatively, in some example embodiments, the diagnostic information may comprise an analog value, such as a voltage and/or current that may be output as a result of performance of a diagnostic test. For example, a voltage and/or current that may be measureable by the test apparatus 404 of some example embodiments may be output via a physical connection(s) that may be provided by the interface 406, such as a connection between a point that may be implemented on the control board 402 and a corresponding probe that may be implemented on the test apparatus 404.

In some example embodiments in which operation 710 may include performance of multiple diagnostic tests, operation 720 may include providing diagnostic information individually for each of a plurality of diagnostic tests. Thus, for example, the diagnostic information may comprise component and/or function specific diagnostic information indicating whether a particular component and/or function passed a diagnostic test. Accordingly, if a fault is detected, the test apparatus 404 and/or operator thereof may identify the particular component(s) and/or function(s) that are faulty. In some embodiments, in which diagnostic information may be provided for each of a plurality of individual tests, the diagnostic information may be provided to the test apparatus 404 on a test-by-test basis as individual tests that may be performed attendant to execution of the onboard diagnostic test are completed. As such, diagnostic information may be provided to the test apparatus 404 while testing attendant to execution of the onboard diagnostic test is ongoing. Alternatively, in some embodiments in which diagnostic information may be provided for each of a plurality of individual tests, the diagnostic information may be aggregated and provided to the test apparatus 404 after performance of all tests performed attendant to execution of the onboard diagnostic test (e.g., after completion of operation 710).

Figure 8:
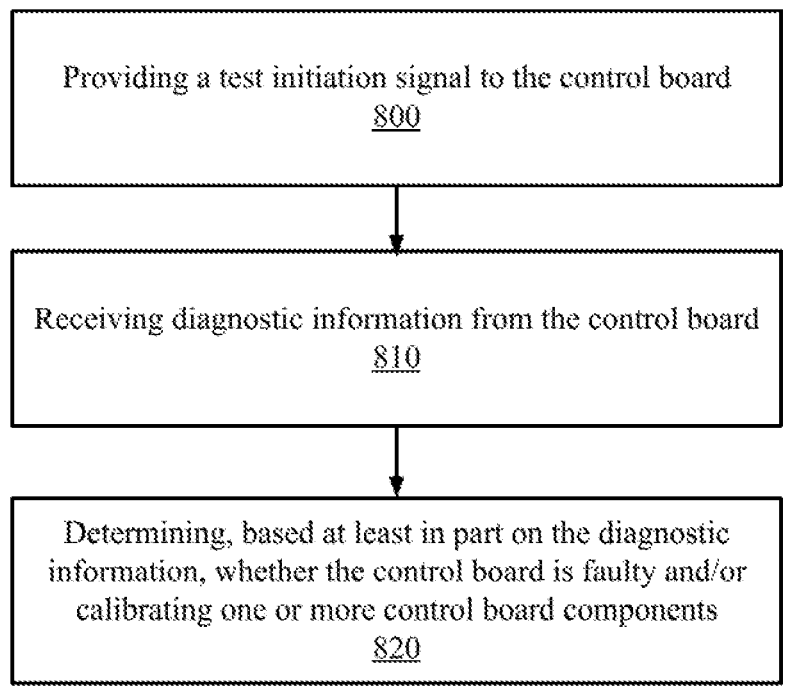

FIG. 8 illustrates a flowchart according to an example method for testing a control board, such as control board 402, for an aerosol delivery device. More particularly, FIG. 8 illustrates a method that may be performed by a test apparatus, such as test apparatus 404, in accordance with some example embodiments. Accordingly, one or more elements of the apparatus 600, such as one or more of processing circuitry 610, processor 612, memory 614, test interface 616, user interface 618, and fault detection and calibration circuitry 620 may, for example, provide means for performing one or more of the operations illustrated in and described with respect to FIG. 8.

Operation 800 may include providing a test initiation signal to the control board 402. The test initiation signal may be provided to the control board 402 via the interface 406. In this regard, operation 800 may include providing the test initiation signal that may be received by the control board 402 in accordance with performance of operation 700 as described above. Thus, for example, in some embodiments, the test initiation signal may comprise a digital signal that may be provided to the control board 402 via a physical communication path, such as may be provided via a serial interface, between the control board 402 and test apparatus 404. As another example, in some embodiments, the test initiation signal may be wirelessly transmitted by the test apparatus 404. Alternatively, in some example embodiments, the test initiation signal may comprise an analog signal, such as a current and/or voltage that may be applied by the test apparatus 404 to a test point(s) that may be implemented on the control board 402 of some example embodiments.

Operation 810 may include receiving diagnostic information from the control board 402. For example, operation 810 may include receiving diagnostic information that may be provided by the control board 402 attendant to performance of operation 720 as described above.

Operation 820 may include determining, based at least in part on the diagnostic information that may be received in operation 810, whether the control board 402 is faulty. For example, in embodiments in which the diagnostic information comprises a digital signal, operation 820 may include extracting diagnostic information carried by the digital signal and determining whether the diagnostic information indicates that the control board 402 is fault. As a further example, in embodiments in which the diagnostic information comprises an analog value, such as a voltage and/or current that may be output by the control board 402 as a result of performance of a diagnostic test, operation 820 may include measuring the value and comparing the measured value to an expected criterion. Thus, for example, operation 820 may include comparing a measured voltage to an expected voltage criterion and/or comparing a measured current to an expected current criterion. If the measured value satisfies the expected criterion (e.g., if the measured value equals an expected value or falls within a range of values indicating proper operation of the control board 402), operation 820 may include determining that the control board 402 (or a component/functionality thereof that is being tested) is not faulty. However, if the measured value does not satisfy the expected criterion, operation 820 may include determining that the control board 402 is faulty.

In embodiments in which the received diagnostic information comprises diagnostic information for each of a plurality of tests (e.g., for each of a plurality of components and/or functions of the control board 402), operation 820 may include determining whether each of a plurality of individual components and/or functions is faulty. Accordingly, if a component and/or function of the control board 402 is faulty, operation 820 may include identifying the faulty component(s) and/or function(s). For example, in some embodiments, operation 820 may include one or more of determining whether the heater circuitry 518 is faulty, determining whether the user interface control circuitry 520 is faulty, determining whether the vibrator 522 is faulty, and determining whether the wireless communication interface 524 is faulty.

In some embodiments, a determination that may be made in operation 820 may be indicated via the user interface 618. For example, in some embodiments, a first indicator light may be illuminated if a fault is detect and a second indicator light may be illuminated if an aspect of the control board 402 is determined to have passed a diagnostic test. As another example, in some embodiments, a first message (e.g., an error message indicating a fault was detected) may be displayed if a fault is detect and a second message (e.g., no fault detected) if an aspect of the control board 402 is determined to have passed a diagnostic test. As a further example, in some embodiments, an audible indication may be provided if a fault is detected and/or if the control board 402 is determined to have passed a diagnostic test. Accordingly, an operator of the test apparatus 404 of some embodiments may determine whether the control board 402 is faulty.

In some embodiments, a voltage and/or current that may be received by the test apparatus 404 attendant to performance of operation 810 may be supplied to an aspect of the user interface 618. For example, a voltage and/or current that may be output by the control board 402 attendant to testing LED control circuitry may be supplied to an LED that may be included in the user interface 618 of some example embodiments so that an operator of the test apparatus 404 of such example embodiments may determine if the LED control circuitry is properly operating based on whether the LED is illuminated.

In some example embodiments, operation 820 may additionally or alternatively include calibrating one or more components on the control board 402 based at least in part on received diagnostic information. For example, operation 820 may include calibrating heater circuitry 518 (e.g., via triggering execution of a software algorithm that may be executed by processor 512) according to a load resistance that may be used to calculate a power output for heating a load. The calibration may, for example, comprise defining an offset from a default (e.g., a plus or minus offset). As such, it will be appreciated in some example embodiments that processing circuitry 510 may be configured to execute one or more calibration routines based on test results and/or signals that may be received from the test apparatus 404 of some example embodiments.

In some example embodiments, diagnostic information that may be received in operation 810 and/or information regarding detected faults (e.g., failure types and/or the like) that may be determined attendant to performance of operation 820 may be stored as performance data. In some such example embodiments, the data may be maintained locally, such as on memory 614. Additionally or alternatively, in some example embodiments, the test apparatus 404 may be in communication with an external computing device and/or external storage via a physical connection and/or via network communication. In some such example embodiments, the test apparatus 404 may provide the data to another device for remote storage. The maintained data may be aggregated to enable making determinations about observed failure types, failure rates, and/or the like, which may be used to influence any updates to control board design.

Figure 9:
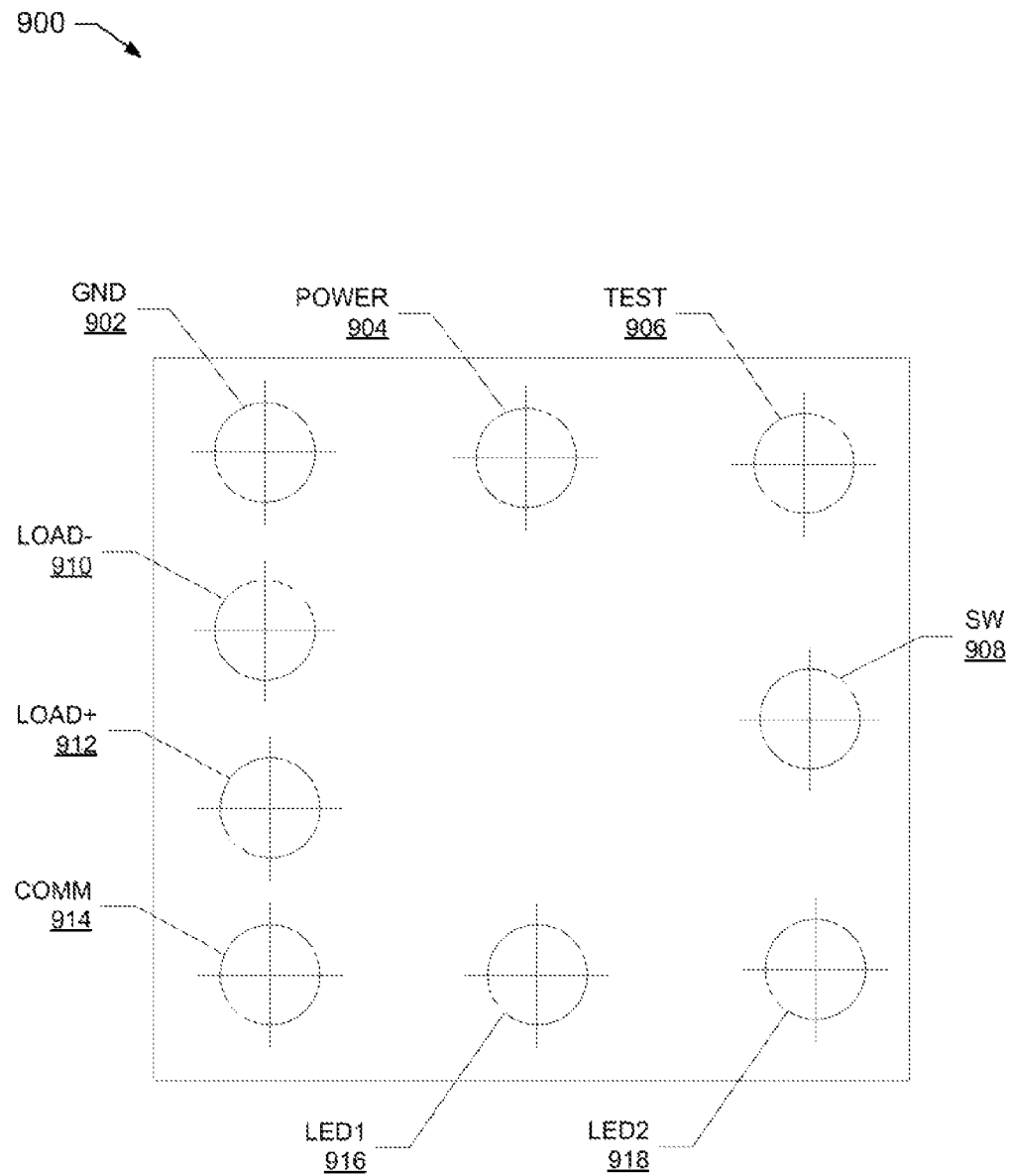

FIG. 9 illustrates an example control board 900 for an aerosol delivery device, such as aerosol delivery device 100, in accordance with some example embodiments of the present disclosure. The control board 900 may, for example, comprise an embodiment of the control board 402. Accordingly, the apparatus 500 or a portion/component(s) thereof may be implemented on the control board 900 in accordance with some example embodiments.

The control board 900 may include a plurality of test points. In the example embodiment of FIG. 9, the plurality of test points are labeled 902-918. The test points 902-918 may provide at least a portion of test interface 516 in accordance with some example embodiments, and may be configured to contact corresponding probes of a test apparatus, such as probes 1002-1018 of the test apparatus 1000 illustrated in and described below with respect to FIG. 10. The test points (and corresponding test apparatus probes) may map to a wide variety of functions in any combination that may be useful in a control board, particularly for use in an aerosol delivery device. The example embodiments described herein in relation to the appended figures are intended to be illustrative of the utility of the present disclosure for testing of a control board, such as for an aerosol delivery device, and the scope of embodiments encompassed by this disclosure should not be viewed as being limited by the exemplary grouping of functions.

The ground (GND) test point 902 may comprise a ground contact that may be used for a ground connection with a test apparatus, such as test apparatus 404 and/or test apparatus 1000. The POWER test point 904 may be used to supply power to the control board 900 during execution of a diagnostic test by the control board 904. The manufacturing test (TEST) test point 906 may be configured to receive a test initiation signal that may be supplied to the control board 900 by a test apparatus, such as test apparatus 404 and/or test apparatus 1000, to provoke execution of an onboard diagnostic test by the control board 900. The switch (SW) test point 908 may be configured to receive a simulated puff input signal that may be supplied by a test apparatus, such as test apparatus 404 and/or test apparatus 1000, in accordance with some example embodiments.

The heater test points (LOAD− 910 and LOAD+ 912) may correspond to connection points for a heater, such as heating element 324. For example the heater test points 910 and 912 may be configured to operatively couple with first and second heating terminals 320*a* and 320*b* in a fully assembled aerosol delivery device.

The communication (COMM) test point 914 may comprise a test point supporting digital communication between the control board 900 and a test apparatus, such as test apparatus 404 and/or test apparatus 1000. For example, the COMM test point 914 may be used by the control board 900 to provide diagnostic information to a test apparatus.

The control board 900 may further include one or more LED test points, such as LED1 916 and LED2 918. The LED test points may be used to test LED control circuitry, and thus may be used to test operation of aspects of the user interface control circuitry 520 in accordance with some example embodiments. For example, the control board 900 may activate LED control circuitry, and a test apparatus may determine if the LED control circuitry is faulty based on diagnostic information (e.g., a current and/or voltage) that may be output by one or both of the LED test points 916 and 918.

It will be appreciated that the shape of the control board 900 is provided by way of example, and not by way of limitation. In this regard, other shapes and sizes of control boards for sue in aerosol delivery devices are contemplated within the scope of the disclosure. Additionally, the selection and spatial arrangement of the test points 902-918 is provided by way of example, and not by way of limitation. Accordingly, control boards in accordance with various embodiments may include additional and/or alternative test points to those illustrated in and described with respect to FIG. 9. Moreover, in some example embodiments, one or more of the test points 902-918 may be omitted.

Figure 10:
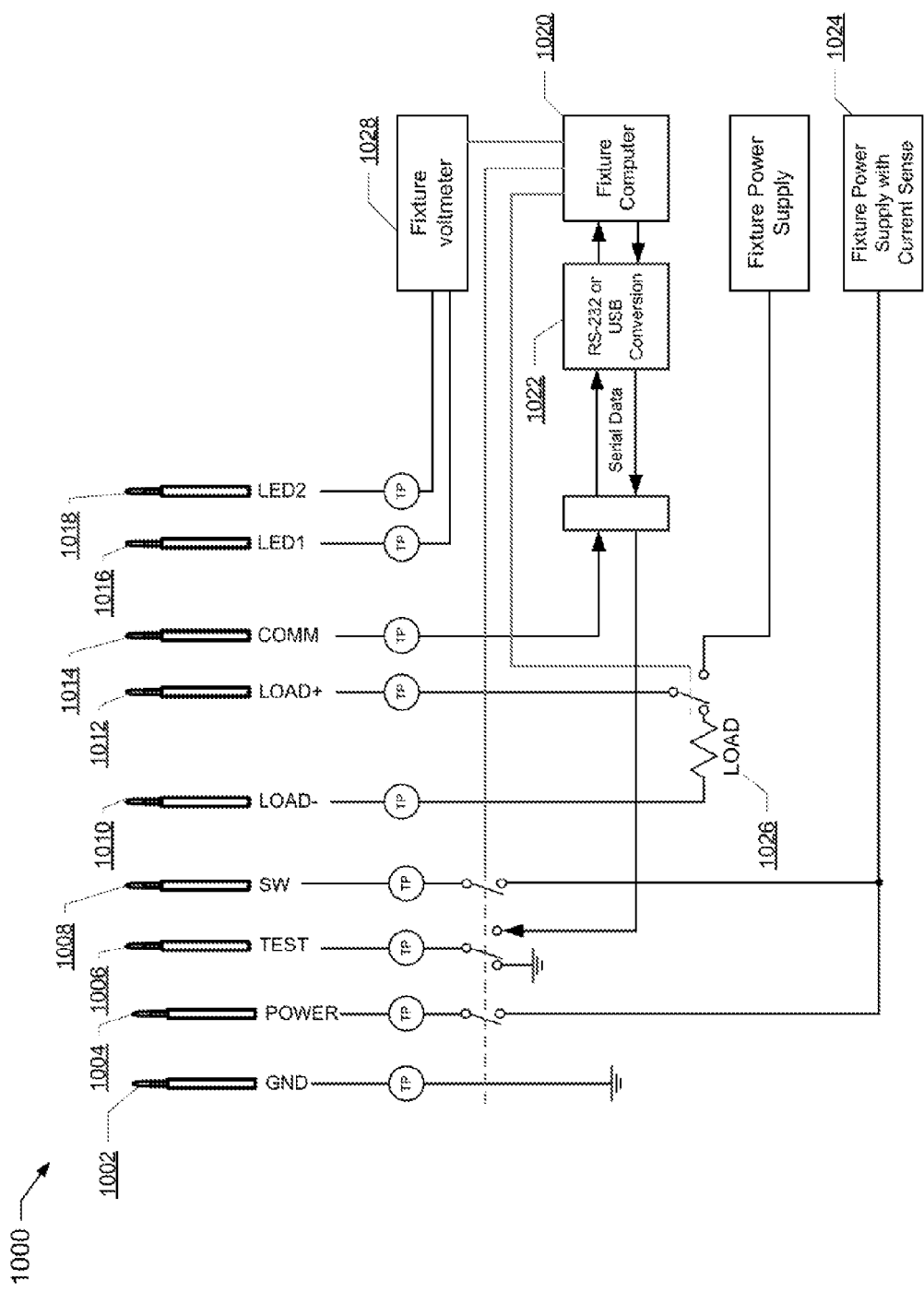

FIG. 10 illustrates an example test apparatus 1000 in accordance with some example embodiments of the present disclosure. The test apparatus 1000 may, for example, comprise an embodiment of the test apparatus 404. Accordingly, the apparatus 600 or a portion/component(s) thereof may be implemented on the test apparatus 1000 in accordance with some example embodiments.

As illustrated in FIG. 10, the test apparatus 1000 may include a plurality of probes 1002-1018 corresponding to the test points 902-918 of the control board 900. The probes 1002-1018 may be configured to contact corresponding test points 902-918 during execution of an onboard diagnostic test by the control board 900 in accordance with various example embodiments.

For example, the GND probe 1002 may be configured to contact the GND test point 902. The POWER probe 1004 may be configured to contact the POWER test point 904, and may be configured to supply power to the control board 900 during execution of a diagnostic test by the control board 900. The TEST probe 1006 may be configured to contact the TEST test point 906, and may be configured to provide a test initiation signal to the control board 900. The SW probe 1008 may be configured to contact the SW test point 908, and may be configured to provide a simulated puff input to the control board 900. The probes, LOAD– 1010 and LOAD 1012, may be configured to contact the load test points 910 and 912, respectively. The COMM probe 1014 may be configured to contact the COMM test point 914 to support communication of digital data, such as diagnostic information, from the control board 900 to the test apparatus 1000 and/or vice versa. The test apparatus 1000 may also include one or more LED probes, such as LED1 1016 and LED2 1018, that may be configured to contact corresponding LED test points (e.g., LED1 916 and LED2 918).

It will be appreciated that the selection probes 1002-1018 illustrated in FIG. 10 is provided by way of example, and not by way of limitation. Accordingly, test apparatuses in accordance with various embodiments may include additional and/or alternative probes to those illustrated in and described with respect to FIG. 10. Moreover, in some example embodiments, one or more of the probes 1002-1018 may be omitted.

The test apparatus 1000 may include a fixture computer 1020. The fixture computer 1020 may, for example, comprise an embodiment of processing circuitry 610. The fixture computer 1020 may be configured to control communication with the control board 900. The fixture computer 1020 may be further configured to evaluate diagnostic information that may be received from the control board 900 to determine if the control board 900 is faulty.

In some example embodiments, the test apparatus 1000 may include a data conversion block 1022, which may be included in and/or operatively coupled with the fixture computer 1020. The data conversion block 1022 may be configured to convert serial data that may be received from the control board 900 (e.g., via the COMM probe 1014) into a format that may be readable by the fixture computer 1020. The data conversion block 1022 may additionally or alternatively be configured to convert a command signal form the fixture computer 1020 into serial data that may be sent to the control board 900. For example, in some embodiments, the data conversion block 1022 may be configured to convert a test initiation command for initiating execution of an onboard diagnostic test by the control board 900 into a test initiation signal that may be provided to the control board 900 via the TEST probe 1006. The data conversion block 1022 may, for example, comprise an RS-232 and/or a USB conversion block. However, it will be appreciated that other serial data protocols are contemplated within the scope of the disclosure.

The test apparatus 1000 may further comprise a power supply 1024. In the illustrated example of FIG. 10, the power supply 1024 may comprise a fixed voltage power supply. However, it will be appreciated that other power supply voltages are contemplated within the scope of the disclosure. The power supply 1024 may be configured to supply power to the control board 900 via the POWER probe 1004. The power supply 1024 may further be configured to apply a voltage for simulating a puff input to the control board 900 via the SW probe 1008. The fixture computer 1020 may be configured to control supply of power from the power supply 1024 via the POWER probe 1004. The fixture computer 1020 may be additionally or alternatively configured to control the application of a voltage for simulating a puff input via the SW probe 1008.

The test apparatus 1000 may additionally comprise a resistance load 1026, which may provide an aspect of the fault detection and calibration circuitry 620 in accordance with some example embodiments. The resistance load 1026 may be configured to emulate a resistance load of a heating element (e.g., heating element 324). In the example of FIG. 10, the resistance load 1026 may comprise a 3 Ohm resistance load. However, it will be appreciated that other resistance values are contemplated within the scope of the disclosure. The resistance load 1026 may be operatively coupled with the heater probes 1010 and 1012 such that the resistance load 1026 may be operatively coupled with the heater test points 910 and 912 of the control board 900 during execution of an onboard diagnostic test by the control board 900. The heater probes 1010 and 1012 and the resistance load 1026 may accordingly provide a return path to enable the control board 900 to test heater circuitry, such as heater circuitry 518, which may be implemented thereon.

The test apparatus 1000 may further comprise a voltmeter 1028, which may provide an aspect of the fault detection and calibration circuitry 620 in accordance with some example embodiments. The voltmeter 1028 may be configured to measure a voltage that may be provided to the test apparatus 1000 as diagnostic information by the control board 900. For example, the voltmeter 1028 may be configured to measure a voltage that may be output by the control board 900 via the LED test points 916 and 918 and received by the test apparatus 1000 via the LED probes 1016 and 1018 attendant to the control board 900 testing LED control circuitry that may be implemented on the control board 900. The fixture computer 1020 may receive an indication of the measured voltage(s) that may be provided by the voltmeter 1028, and may determine based on the voltage value(s) whether LED control circuitry of the control board 900 is faulty.

Figure 11A:
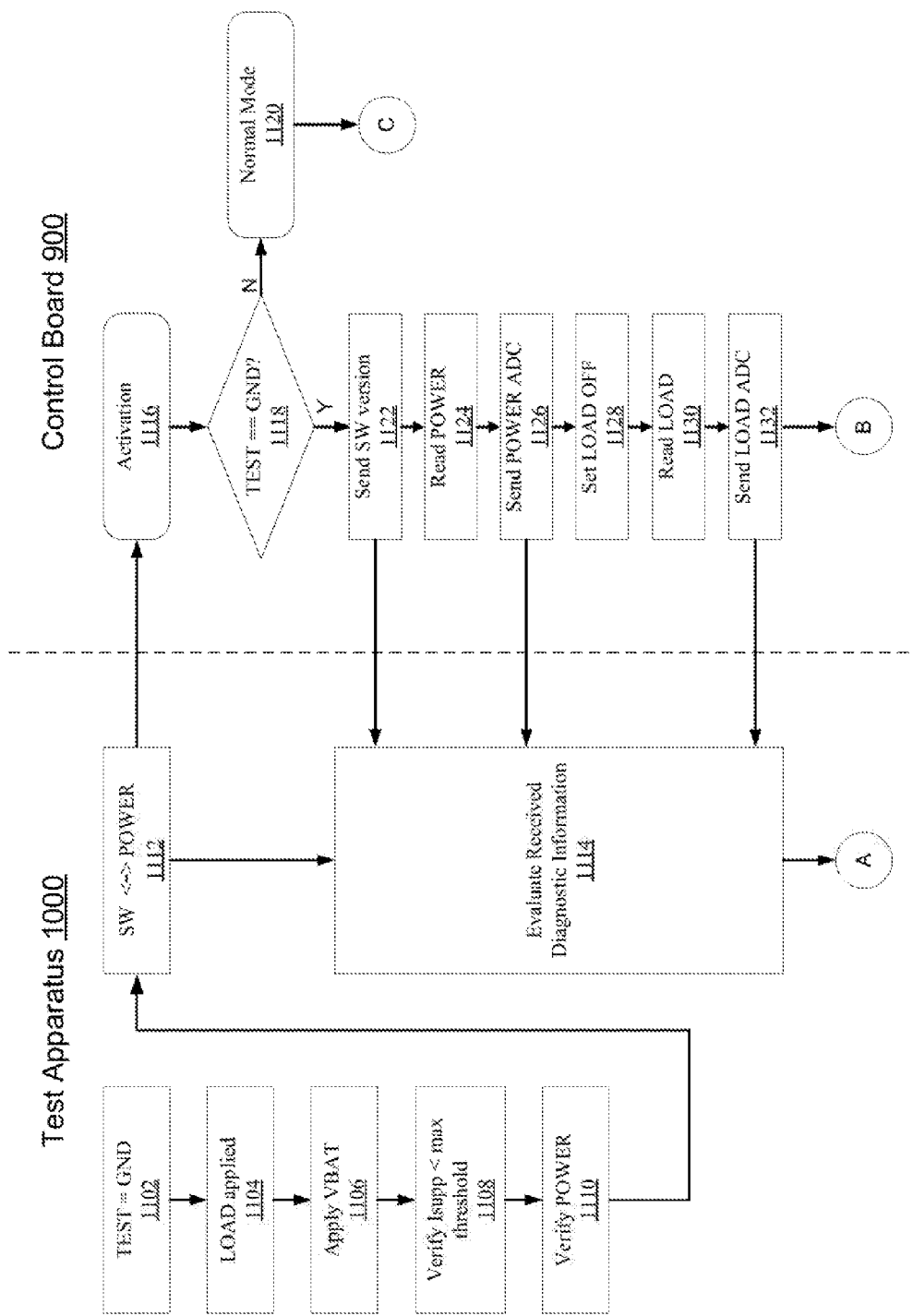
Figure 11B:
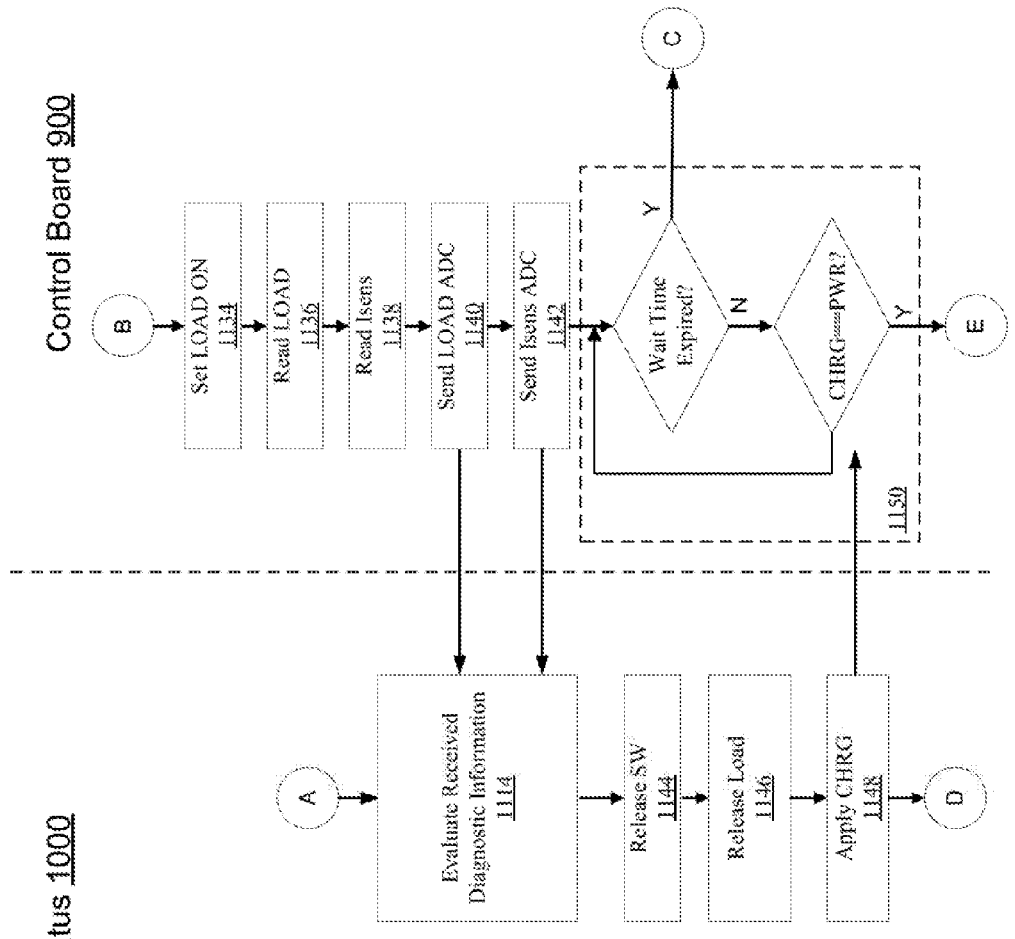
Figure 11C:
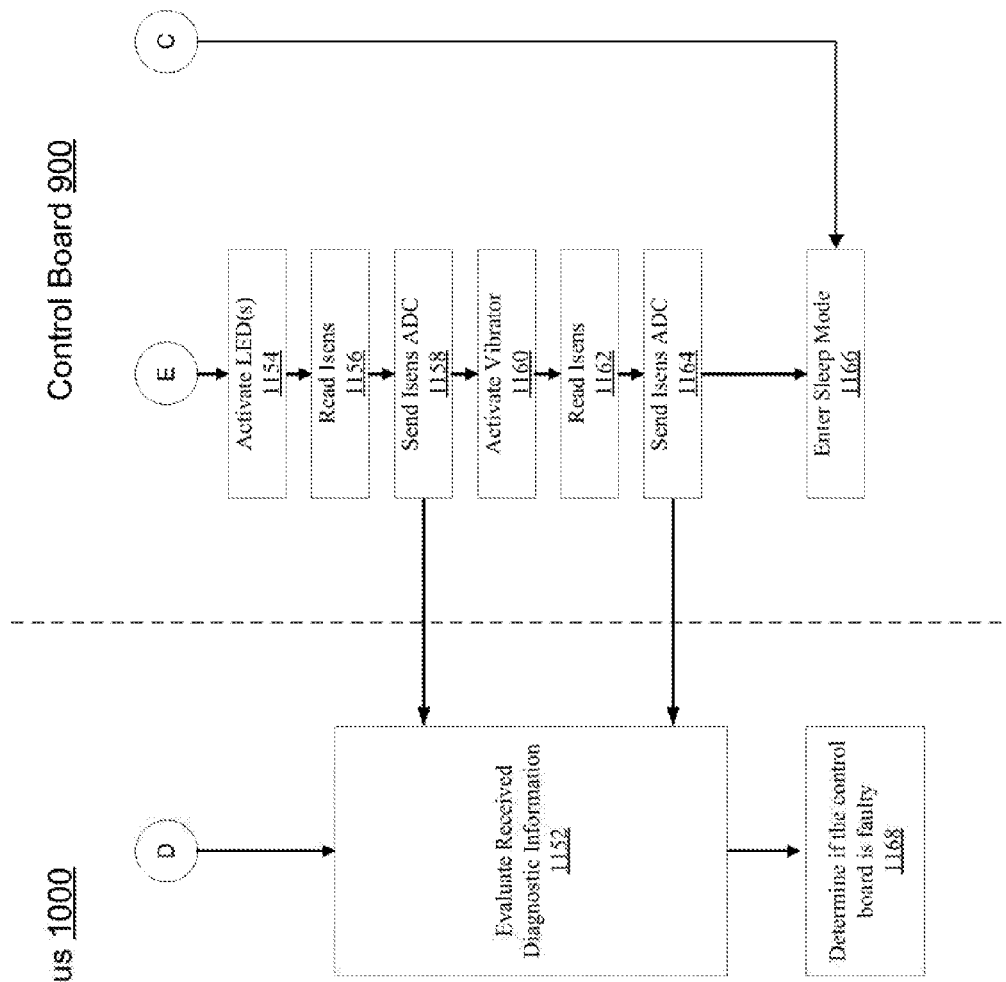

FIGS. 11A-11C illustrate an example method that may be performed by the control board 900 and the test apparatus 1000 for testing the control board 900 in accordance with some example embodiments of the present disclosure. In this regard, the control board 900 and test apparatus 1000 may be disposed such that the probes 1002-1018 are in operative contact with the test points 902-918 during performance of the method illustrated in and described with respect to FIGS. 11A-11C.

Referring first to FIG. 11A, the test apparatus 1000 may perform one or more of operations 1102-1112 to initiate execution of an onboard diagnostic test by the control board 900. Operation 1102 may include the fixture computer 1020 setting the output of the TEST probe 1006 to GND. Operation 1104 may include the test apparatus 900 closing the path between the heater probes 1010 and 1012 (e.g., by closing the switch that may be used to connect the heater probe 1012 to the resistance load 1026, as illustrated in FIG. 10) such that a resistance of the return path between the LOAD− probe 1010 and the LOAD+ probe 1012 may be equivalent to the resistance load 1026 (e.g., 3 Ohms as illustrated by way of non-limiting example). Operation 1106 may include the power supply 1024 applying power to the POWER probe 1004 to power the control board 900 during execution of the onboard diagnostic test.

Operation 1108 may include the test apparatus 1000 verifying that the current from the power supply 1024 to the POWER probe 1004 is less than a maximum threshold current. For example, in some embodiments, the maximum threshold current may be 10 microamps (uA). However, it will be appreciated that the maximum threshold current may vary depending on the particular configurations of the test apparatus 1000 and control board 900.

Operation 1110 may include the test apparatus 1000 verifying that POWER equals an expected fixed voltage level.

Operation 1112 may include the fixture computer 1020 setting the output of the SW probe 1008 equal to the output of the POWER probe 1004. For example, the fixture computer 1020 may close a switch connecting the SW probe 1008 with the power supply 1024. In this regard, operation 1112 may include the test apparatus 1000 simulating a puff input to the control board 900 to cause the control board 900 to test operations that may be performed in response to a puff input to a fully assembled aerosol delivery device comprising the control board 900. Operation 1114 may include the test apparatus 1000 (e.g., the fixture computer 1020) receiving and evaluating diagnostic information that may be provided by the control board 900 during execution of a first portion of the onboard diagnostic test as illustrated in and further described below with respect to FIGS. 11A and 11B.

Operation 1116 may include the control board 900 detecting the output of the SW probe 1008 that may be applied by the test apparatus 1000 in operation 1112 as a puff input. The control board 900 may verify that the control board 900 is operating in a diagnostic test mode in response to the puff input. In this regard, operation 1118 may include determining if the input of the TEST test point 906 is equal to GND. If the input of the TEST test point 906 is not equal to ground, the control board 900 may determine that it is operating in a normal mode (i.e., not a diagnostic mode), as illustrated by operation 1120, and the method may proceed to reference C in FIG. 11C.

If, however, the control board 900 determines in operation 1118 that the input of the TEST test point 906 is equal to GND, the control board 900 may determine that it is operating in a diagnostic mode, and may proceed to execute an onboard diagnostic test, beginning with operation 1122. As illustrated and described with respect to operation 1102, the test apparatus 1000 may set the output of the TEST probe 1006 equal to GND so as to place the control board 900 in diagnostic mode prior to applying the simulated puff input in operation 1112.

Operation 1122 may include the control board 900 providing an indication of the software (SW) version(s) for software, firmware, and/or the like that may be installed on the control board 900 to the test apparatus 1000 (e.g., via a connection between the COMM test point 914 and the COMM probe 1014). The test apparatus 1000 may accordingly verify that a current and/or otherwise expected software version is installed on the control board 900.

Operation 1124 may include the control board 900 reading the input from the POWER test point 1004. The control board 900 may use an analog to digital converter (ADC) to determine a digital representation of the analog value read in operation 1124, and may send the digital representation of the POWER value to the test apparatus 1000, at operation 1126. The test apparatus 1000 may accordingly verify attendant to performance of operation 1114 that the control board 900 is receiving an appropriate power supply voltage so as to verify proper configuration and operation of power circuitry that may be implemented on the control board 900.

Operation 1128 may include the control board 900 setting the state of load circuitry (e.g., heater circuitry 518) that may be implemented on the control board 900 to OFF. The control board 900 may read a voltage value across the heater test points 910 and 912, at operation 1130. Operation 1132 may include the control board 900 using an ADC to determine a digital representation of the voltage value that may be read at operation 1130 and sending the digital representation to the test apparatus 1000. The test apparatus 1000 may verify that the read voltage satisfies an expected voltage criterion attendant to performance of operation 1114.

The test apparatus 1000 may continue performance of operation 1114 as illustrated by reference A on FIG. 11B. Execution of the diagnostic test by the control board 900 may continue to reference B on FIG. 11B.

Referring now to FIG. 11B, operation 1134 may include the control board 900 setting the state of load circuitry (e.g., heater circuitry 518) that may be implemented on the control board 900 to ON so as to activate the load circuitry. Operation 1136 may include the control board 900 reading a voltage across the heater test points 910 and 912. Operation 1138 may include the control board 900 reading a current (Isens) flowing along a return path (e.g., to one of the LOAD− test point 910 and the LOAD+ test point 912) provided by the resistance load 1026 that may be operatively coupled with the load test points 910 and 912 via the heater probes 1010 and 1012. Operation 1140 may include the control board 900 using an ADC to determine a digital representation of the voltage value that may be read at operation 1136 and sending the digital representation to the test apparatus 1000. The test apparatus 1000 may verify that the voltage value satisfies an expected voltage criterion attendant to performance of operation 1114. Operation 1142 may include the control board 900 using an ADC to determine a digital representation of the current value that may be read at operation 1138 and sending the digital representation to the test apparatus 1000. The test apparatus 1000 may verify that the current value satisfies an expected current criterion attendant to performance of operation 1114.

Operation 1144 may include the test apparatus 1000 releasing the SW signal so as to terminate the simulated puff input after the control board 900 has completed testing operations that may be performed in response to a puff input and provided diagnostic information generated based on the tests to the test apparatus 1000 attendant to performance of operations 1122-1142. Operation 1146 may include the test apparatus 1000 releasing the resistance load 1026 from the heater probes 1010 and 1012, such as by opening a switch that may be used to connect the heater probe 1012 to the resistance load 1026, as illustrated in FIG. 10.

Operation 1148 may include the test apparatus 1000 applying a charge (CHRG). The method that may be performed by the test apparatus 1000 may proceed to reference D in FIG. 11C.

After completing operation 1142, the control board 900 may wait for up to a defined wait time period for CHRG to equal an expected power level (PWR), as illustrated by operation 1150. If the defined wait time period expires prior to CHRG being applied by the test apparatus 1000 (e.g., operation 1148), the control board 900 may terminate execution of the onboard diagnostic test, and may proceed to reference C in FIG. 11C. However, if the test apparatus 1000 applies CHRG prior to expiration of the defined wait time period such that CHRG equals PWR, the control board 900 may continue execution of the onboard diagnostic test, and may proceed to reference E in FIG. 11C.

Referring now to FIG. 11C, the test apparatus 1000 may continue from reference D with performance of operation 1152, which may include the test apparatus 1000 (e.g., the fixture computer 1020) receiving and evaluating diagnostic information that may be provided by the control board 900 during the next phase of execution of the onboard diagnostic test, as illustrated in and described with respect to operations 1154-1164.

Referring to reference E in FIG. 11C, if the control board 900 detects that CHRG equals PWR within the defined wait time period in operation 1150, the control board 900 may test operation of LED control circuitry. In this regard, operation 1154 may include the control board 900 activating the LED control circuitry as the control board 900 would if it was installed in an aerosol delivery device comprising an LED(s) operatively coupled with the LED control circuitry. Operation 1156 may include the control board 900 reading a current (Isens) that may result from activation of the LED control circuitry. Operation 1158 may include the control board 900 using an ADC to determine a digital representation of the current value that may be read at operation 1156 and sending the digital representation to the test apparatus 1000. The test apparatus 1000 may verify that the current value satisfies an expected current criterion attendant to performance of operation 1152.

The control board 900 may next test operation of a vibrator (e.g., vibrator 522). In this regard, operation 1160 may include the control board 900 activating the vibrator. Operation 1162 may include the control board 900 reading a current (Isens) that may result from activation of the vibrator. Operation 1164 may include the control board 900 using an ADC to determine a digital representation of the current value that may be read at operation 1163 and sending the digital representation to the test apparatus 1000. The test apparatus 1000 may verify that the current value satisfies an expected current criterion attendant to performance of operation 1152.

After testing the vibrator, the control board 900 may enter a sleep mode, as illustrated by operation 1166. As illustrated by reference C, if the control board 900 determines at operation 1118 that the control board 900 is operating in a normal mode (e.g., the TEST test point 906 is not equal to ground), the control board 900 may proceed to operation 1166 and enter the sleep mode without executing the onboard diagnostic test. Likewise, if the defined wait time period expires at operation 1150 prior to the test apparatus applying CHRG, the control board 900 may proceed to operation 1166 and enter the sleep mode without continuing the onboard diagnostic test.

Operation 1168 (e.g., the fixture computer 1020) may include the test apparatus 1000 determining, based on the evaluation of diagnostic information in operations 1114 and 1152, if the control board 900 is faulty. In some embodiments, an indication of the determination may be provided to an operator of the test apparatus 1000 (e.g., via user interface 618).

Some example embodiments may be applied for forming an aerosol delivery device. In this regard, a process for forming an aerosol delivery device may include interfacing a control board including load circuitry (e.g., heater circuitry 518 in FIG. 5), such as an embodiment of the control board 402 and/or of the control board 900, with a test apparatus, such as an embodiment of the test apparatus 404 and/or of the test apparatus 1000, to determine if the control board is faulty. For example, a test interface of the control board (e.g., the test interface 516 illustrated in FIG. 5) may be interface with a test interface of the test apparatus (e.g., the test interface 616 illustrated in FIG. 6).

After interfacing the control board with the test apparatus, the control board may be combined with a power source within a housing so that the control board may include an electrical connection from the heater circuitry that may be configured for power delivery to a heating element. The housing may comprise a housing for a control body (e.g., the control body 200) for an aerosol delivery device, and the heater circuitry may be implemented within a cartridge (e.g., the cartridge 300) that may be configured to mate with the control body. The aerosol delivery device that may be formed through this process may, for example, comprise an aerosol delivery device as illustrated in and described with respect to FIGS. 1-3. In some example embodiments, the control board may be combined with the power source within the housing only if there is not any faulty circuitry identified through interfacing the control board with the test apparatus. In this regard, a faulty control board may be discarded or repaired prior to being combined with a power source and integrated into a housing to form an aerosol delivery device.

Some example embodiments provide a test apparatus that may be configured to test operation of a fully assembled control body for an aerosol delivery device, such as the control body 200. The fully assembled control body may include a control board, such as control board 402 and/or control board 900. Accordingly, the apparatus 500 or a portion/component(s) thereof may be implemented on the control body that may be tested in accordance with some example embodiments. In some example embodiments, the test apparatus 404 may be configured to test operation of a fully assembled control body. For example, the test interface 616 may be configured to communicatively engage a control body interface that may be used to couple a cartridge (e.g., cartridge 300) with the control body. Thus, for example, the test interface 616 may be configured to receive at least a portion of a control body and couple with the control body via a connection point, such as the coupler 202 of the control body 200. The control body interface may be used by the test apparatus 404 of such example embodiments to trigger performance of a diagnostic test by the control body.

Figure 12:
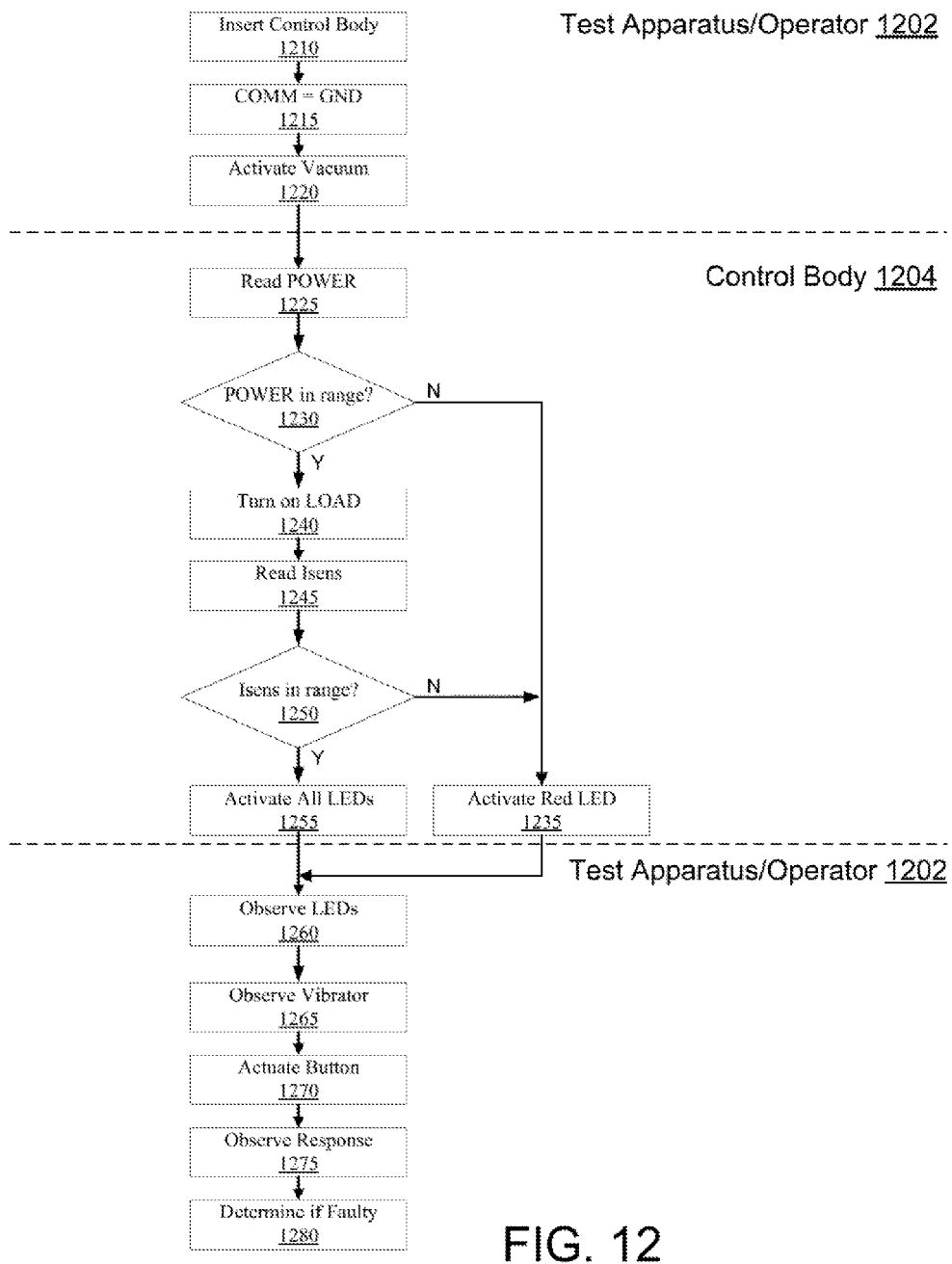

FIG. 12 illustrates an example method for testing components of a fully assembled control body for an aerosol delivery device in accordance with some example embodiments of the present disclosure. In this regard, FIG. 12 illustrates operations that may be performed by a test apparatus 1202 (and/or an operator thereof) and a control body 1204 to test operation of the control body 1204 in accordance with some example embodiments.

The test apparatus 1202 may, for example, comprise an embodiment of the test apparatus 404 and/or test apparatus 1000. Accordingly, one or more elements of the apparatus 600, such as one or more of processing circuitry 610, processor 612, memory 614, test interface 616, user interface 618, and fault detection and calibration circuitry 620 may, for example, provide means for performing one or more of the operations described to be performed by the test apparatus 1202.

The control body 1204 may include a control board, such as the control board 402 and/or control board 900. Accordingly, one or more elements of the apparatus 500, such as one or more of processing circuitry 510, processor 512, memory 514, test interface 516, heater circuitry 518, user interface control circuitry 520, vibrator 522, and wireless communication interface 524 may, for example, provide means for performing one or more of the operations described to be performed by the control body 1204.

With reference to FIG. 12, operation 1210 may include an operator of the test apparatus 1202 inserting at least a portion of the control body 1204 into an interface configured to receive the control body 1204 and/or otherwise communicatively coupling the control body 1204 with the test apparatus 1202. Operation 1215 may include the test apparatus 1202 setting a COMM input of the control body 1204 to GND. Operation 1220 may include the test apparatus 1202 activating a vacuum so as to create a pressure drop configured to simulate a pressure drop occurring during a puff input to an aerosol delivery device.

The control body 1204 may detect the simulated puff input resulting from activation of the vacuum. In response to detecting the simulated puff input while the COMM input is set to GND, the control body 1204 may execute a diagnostic test routine, as illustrated in and described with respect to operations 1230-1255.

Operation 1225 may include the control body 1204 reading a power supply value, POWER. Operation 1235 may include the control body 1204 determining whether the power supply value is within an expected power range. If it is determined that the read power supply value is not within the expected power range, the control body 1204 may determine that a fault is present, and may proceed to operation 1235, which may include providing an error indication that may be observable to the operator of the test apparatus 1202. For example, in the example of FIG. 12, a red LED indicating an error condition may be activated in operation 1235. It will be appreciated, however, that alternate error indications, including various visual, audible, and/or mechanical (e.g., vibratory) indications, are contemplated within the scope of the disclosure.

If, however, it is determined in operation 1230 that the power supply value is within the expected power range, the method may instead proceed to operation 1240, which may include the control body 1204 activating load circuitry (e.g., heating circuitry 518). Operation 1245 may include reading a current (Isens) resulting from activation of the heating circuitry. Operation 1250 may include determining if the read current value is within an expected current range. If, it is determined that the read current value is not within the expected current range, the control body 1204 may determine that a fault is present, and may proceed to operation 1235, which may include providing an error indication that may be observable to the operator of the test apparatus 1202, as described above.

If, however, it is determined at operation 1250 that the read current value is within the expected current range, the control body 1204 may determine that a fault has not been detected. As such, the control body 1204 may provide an indication that a fault was not detected that may be observed by an operator of the test apparatus 1202. For example, as illustrated in operation 1255, the indication may be activating an LED(s) defined to indicate that no fault has been detected, such as by activating all LEDs that may be implemented on the control body 1204. However, it will be appreciated that alternate indications, including various visual, audible, and/or mechanical (e.g., vibratory) indications, that a fault was not detected are contemplated within the scope of the disclosure.

Operation 1260 may include an operator of the test apparatus 1202 may observe an indication that may be provided by the control body 1204 to determine if the control body 1204 has detected a fault. For example, operation 1260 may include the operator observing LED(s) that may be illuminated by the control body 1204 in operation 1235 or operation 1255. Accordingly, the operator of the test apparatus 1202 if a fault has been detected by the control body 1204.

Operation 1265 may include the control body 1204 testing operation of a vibrator (e.g., vibrator 522) that may be implemented on the control body 1204 of some example embodiments. The operator of the test apparatus 1202 may observe the control body 1204, such as by looking for an expected vibration characteristic, to verify that the vibrator is properly operating.

Operation 1270 may include the operator of the test apparatus 1202 and/or the test apparatus 1202, itself, actuating a user input button(s) that may be used to activate a functionality of and/or otherwise control operation of an aerosol delivery device. Operation 1275 may include the operator observing a response to actuation of the button to verify that the control body 1204 responds as expected (e.g., as normal) to actuation of the button. Operation 1280 may include the test apparatus 1202 and/or operator thereof determining if the control body 1204 is faulty based on the test observations.

In accordance with some embodiments, test techniques described herein may be used in combination with assembly techniques disclosed in U.S. application Ser. No. 14/227,159 to Ampolini et al., filed Mar. 27, 2014, which is incorporated herein by reference in its entirety, to verify operability of components of an aerosol delivery device that may be assembled in accordance with the assembly techniques disclosed in U.S. application Ser. No. 14/227,159.

It will be understood that each block of the flowcharts, and combinations of blocks in the flowcharts, may be implemented by various means, such as hardware and/or a computer program product comprising one or more computer-readable mediums having computer readable program instructions stored thereon. For example, one or more of the procedures described herein may be embodied by computer program instructions of a computer program product. In this regard, the computer program product(s) which may embody the procedures described herein may be stored by one or more memory devices of a computing device and executed by a processor in the computing device. In some embodiments, the computer program instructions comprising the computer program product(s) which embody the procedures described above may be stored by memory devices of a plurality of computing devices. As will be appreciated, any such computer program product may be implemented on a computer or other programmable apparatus to produce a machine, such that the computer program product including the instructions which execute on the computer or other programmable apparatus creates means for implementing the functions specified in the flowchart block(s). Further, the computer program product may comprise one or more computer-readable memories on which the computer program instructions may be stored such that the one or more computer-readable memories can direct a computer or other programmable apparatus to function in a particular manner, such that the computer program product comprises an article of manufacture which implements the function specified in the flowchart block(s). The computer program instructions of one or more computer program products may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s). Accordingly, blocks of the flowcharts support combinations of means for performing the specified functions. It will also be understood that one or more blocks of the flowcharts, and combinations of blocks in the flowcharts, may be implemented by special purpose hardware-based computer systems which perform the specified functions, or combinations of special purpose hardware and computer program product(s).

Moreover, it will be appreciated that the ordering of blocks and corresponding method operations within the flowchart is provided by way of non-limiting example in order to describe operations that may be performed in accordance some example embodiments. In this regard, it will be appreciated that the ordering of blocks and corresponding method operations illustrated in the flowchart is non-limiting, such that the ordering of two or more block illustrated in and described with respect to the flowchart may be changed and/or method operations associated with two or more blocks may be at least partially performed in parallel in accordance with some example embodiments. Further, in some embodiments, one or more blocks and corresponding method operations illustrated in and described with respect to the flowchart may be optional, and may be omitted.

Many modifications and other embodiments of the disclosure will come to mind to one skilled in the art to which this disclosure pertains having the benefit of the teachings presented in the foregoing descriptions and the associated drawings. Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

The invention claimed is:

1. A control board for an aerosol delivery device, the control board comprising:
   an interface configured to communicatively couple with a test apparatus;
   a wireless communication interface; and
   processing circuitry operatively coupled with the interface, wherein the processing circuitry is configured to cause the control board to at least:
      execute an onboard diagnostic test to test operation of the control board in response to a test initiation signal received from the test apparatus via the interface;
      test the wireless communication interface during execution of the onboard diagnostic test; and
      provide diagnostic information generated based at least in part on execution of the onboard diagnostic test to the test apparatus via the interface.

2. The control board of claim 1, wherein the interface comprises one or more test points configured to contact one or more corresponding probes of the test apparatus during execution of the onboard diagnostic test.

3. The control board of claim 1, wherein the interface comprises a wireless communication interface configured to one or more of:
   wirelessly receive the test initiation signal; and
   wirelessly transmit at least a portion of the diagnostic information to the test apparatus.

4. The control board of claim 1, wherein the control board comprises heater circuitry configured to power a heating element configured to heat aerosol precursor composition to form an inhalable substance, and wherein the processing circuitry is further configured to cause the control board to test operation of the heater circuitry during execution of the onboard diagnostic test.

5. The control board of claim 4, wherein the interface comprises a pair of heater test points, and wherein processing circuitry is further configured to cause the control board to test operation of the heater circuitry at least in part by causing the control board to:
   activate the heater circuitry;
   measure a current flowing through a return path connecting the pair of heater test points, wherein the return path is formed by the test apparatus; and
   verify that the measured current satisfies an expected current criterion.

6. The control board of claim 1, wherein the control board comprises user interface control circuitry, and wherein the processing circuitry is further configured to cause the control board to test operation of the user interface control circuitry during execution of the onboard diagnostic test.

7. The control board of claim 1, wherein the control board comprises a vibrator, and wherein the processing circuitry is further configured to cause the control board to test operation of the vibrator during execution of the onboard diagnostic test.

8. An aerosol delivery device comprising the control board of claim 1.

9. A method for testing a control board for an aerosol delivery device, wherein the control board comprises a wireless communication interface, the method comprising the control board:
   receiving a test initiation signal from a test apparatus;
   executing an onboard diagnostic test in response to the test initiation signal;
   testing the wireless communication interface during execution of the onboard diagnostic test; and providing diagnostic information generated based at least in part on execution of the onboard diagnostic test to the test apparatus.

10. The method of claim 9, wherein the method further comprises the control board:
   detecting a simulated puff input during execution of the onboard diagnostic test; and
   in response to the simulated puff input, testing performance of at least one operation that the control board is configured to perform in response to a puff input to an aerosol delivery device comprising the control board.

11. The method of claim 9, wherein executing the onboard diagnostic test comprises testing operation of heater circuitry implemented on the control board, and wherein the diagnostic information comprises an indication of whether there is a fault in the heater circuitry.

12. The method of claim 11, wherein testing operation of the heater circuitry comprises:
   activating the heater circuitry;
   measuring a current flowing through a return path connecting a pair of heater test points implemented on the control board, wherein the return path is formed by the test apparatus; and
   verifying that the measured current satisfies an expected current criterion.

13. The method of claim 9, wherein executing the onboard diagnostic test comprises one or more of testing operation of user interface control circuitry, testing operation of a vibrator, and testing operation of a wireless communication interface.

14. A test apparatus for testing a control board for an aerosol delivery device, the test apparatus comprising:
   an interface configured to communicatively couple with the control board, wherein the interface comprises one or more probes configured to contact one or more corresponding test points of the control board;
   circuitry configured to form a return path between a pair of test points of the control board; and
   processing circuitry operatively coupled with the interface, wherein the processing circuitry is configured to cause the test apparatus to at least:
      provide a test initiation signal to the control board via the interface;
      receive, via the interface, diagnostic information from the control board; and
      determine, based at least in part on the diagnostic information, whether the control board is faulty.

15. The test apparatus of claim 14, wherein the interface comprises a wireless communication interface configured to one or more of:
   wirelessly transmit the test initiation signal; and
   wirelessly receive at least a portion of the diagnostic information.

16. The test apparatus of claim 14, wherein the test apparatus further comprises:
   a resistance load configured to operatively couple with heater circuitry of the control board, wherein the resistance load is further configured to emulate a resistance load of a heating element configured to heat aerosol precursor composition to form an inhalable substance.

17. The test apparatus of claim 14, wherein determining whether the control board is faulty comprises one or more of:
   determining whether heater circuitry is faulty;
   determining whether user interface control circuitry is faulty;
   determining whether a vibrator is faulty; and
   determining whether a wireless communication interface is faulty.

* * * * *